US010908636B2

(12) United States Patent
Tomar

(10) Patent No.: US 10,908,636 B2
(45) Date of Patent: Feb. 2, 2021

(54) SKEW CORRECTION FOR SOURCE SYNCHRONOUS SYSTEMS

(71) Applicant: SanDisk Technologies LLC, Plano, TX (US)

(72) Inventor: Bhawna Tomar, Karnataka (IN)

(73) Assignee: SanDisk Technologies LLC, Addison, TX (US)

( * ) Notice: Subject to any disclaimer, the term of this patent is extended or adjusted under 35 U.S.C. 154(b) by 176 days.

(21) Appl. No.: 15/858,460

(22) Filed: Dec. 29, 2017

(65) Prior Publication Data

US 2019/0129465 A1 May 2, 2019

Related U.S. Application Data

(60) Provisional application No. 62/579,591, filed on Oct. 31, 2017.

(51) Int. Cl.
| | |
|---|---|
| *G06F 11/00* | (2006.01) |
| *G06F 1/10* | (2006.01) |
| *G11C 7/10* | (2006.01) |
| *G06F 13/16* | (2006.01) |

(52) U.S. Cl.
CPC ............ *G06F 1/10* (2013.01); *G06F 13/1689* (2013.01); *G11C 7/1093* (2013.01); *G11C 7/1066* (2013.01)

(58) Field of Classification Search
CPC .................. G06F 1/10; G06F 2207/388; G01R 31/31725; G01R 31/319337; G11C 7/06
USPC .......................... 714/700, 731, 744, 814, 815
See application file for complete search history.

(56) References Cited

U.S. PATENT DOCUMENTS

| | | | | | |
|---|---|---|---|---|---|
| 5,467,464 | A | * | 11/1995 | Oprescu | ................... G06F 1/10 713/400 |
| 5,652,530 | A | * | 7/1997 | Ashuri | ...................... G06F 1/10 326/93 |
| 6,157,229 | A | * | 12/2000 | Yoshikawa | ............... H03L 7/07 327/147 |
| 6,336,192 | B1 | * | 1/2002 | Sakamoto | ............... H04L 25/14 713/503 |
| 6,586,977 | B2 | | 7/2003 | Yang et al. | |
| 6,674,686 | B2 | | 1/2004 | Noh et al. | |
| | | | (Continued) | | |

OTHER PUBLICATIONS

"AN 433: Constraining and Analyzing Source-Synchronous Interfaces", Altera Corporation, May 2016, pp. 1-56.

*Primary Examiner* — Albert Decady
*Assistant Examiner* — Osman M Alshack
(74) *Attorney, Agent, or Firm* — Vierra Magen Marcus LLP

(57) ABSTRACT

A circuit may perform a skew correction process that positions clock pulses of an output clock signal in respective target sampling positions. The circuit may receive an input clock signal and an input data signal and select one of a plurality of predetermined skew cases for the input clock signal and the input data signal. In addition, the circuit may performing timing relationship measurements for transition permutations of the clock signal and the data signal. The circuit may determine which of the input clock signal and the input data signal to delay and an amount of the delay based on the selected skew case and the timing relationship measurements. An output of the circuit may delay the input clock signal or the input data signal according to the determinations, which centers the sampling transitions of the clock signal in target sampling positions.

18 Claims, 8 Drawing Sheets

(56) References Cited

U.S. PATENT DOCUMENTS

| | | |
|---|---|---|
| 7,031,420 B1* | 4/2006 | Jenkins .................... G06F 1/10 |
| | | 327/149 |
| 7,034,597 B1 | 4/2006 | Mo et al. |
| 7,042,914 B2 | 5/2006 | Zerbe et al. |
| 7,092,474 B2 | 8/2006 | Cao |
| 9,030,244 B1 | 5/2015 | Luo et al. |
| 9,263,103 B2 | 2/2016 | Giovannini et al. |
| 9,485,081 B2* | 11/2016 | Ahn ...................... H04L 7/0016 |
| 2001/0013802 A1* | 8/2001 | Faulcon ................. H03L 7/091 |
| | | 327/244 |
| 2008/0063128 A1* | 3/2008 | Chatwin ............. H03D 13/004 |
| | | 375/375 |
| 2010/0002822 A1* | 1/2010 | Arima ................. H04L 7/0337 |
| | | 375/371 |
| 2010/0054760 A1* | 3/2010 | Fukuda ................. H04B 10/69 |
| | | 398/202 |
| 2015/0185758 A1* | 7/2015 | Jung ........................ G06F 1/10 |
| | | 713/401 |
| 2015/0229467 A1* | 8/2015 | Lee ...................... H04L 7/0016 |
| | | 375/371 |
| 2016/0118010 A1* | 4/2016 | Hsu ........................ G09G 5/008 |
| | | 345/213 |
| 2016/0308540 A1 | 10/2016 | Subramanian et al. |
| 2017/0054549 A1 | 2/2017 | Stott et al. |

\* cited by examiner

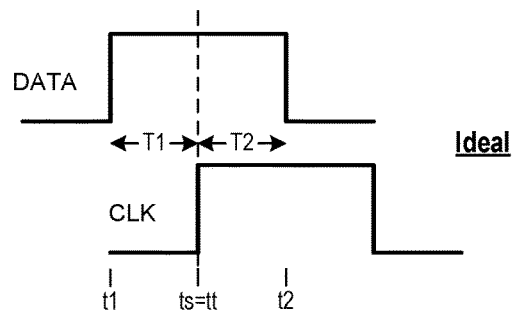
FIG. 3A
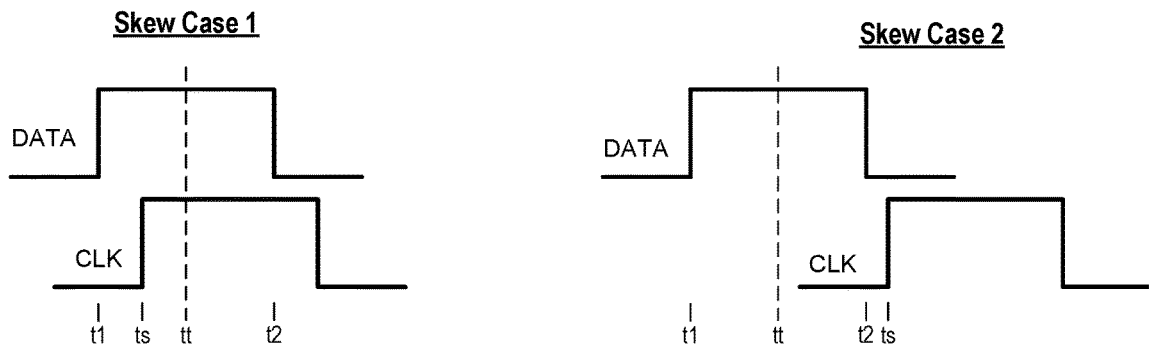
FIG. 3B
FIG. 3C
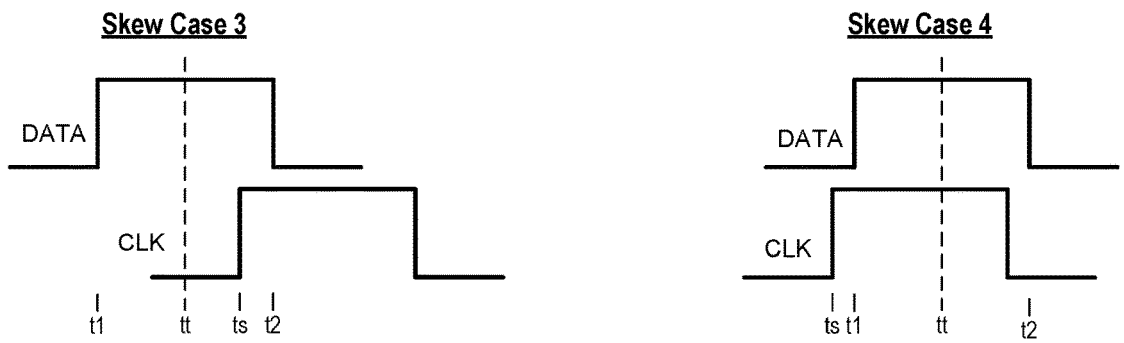
FIG. 3D
FIG. 3E
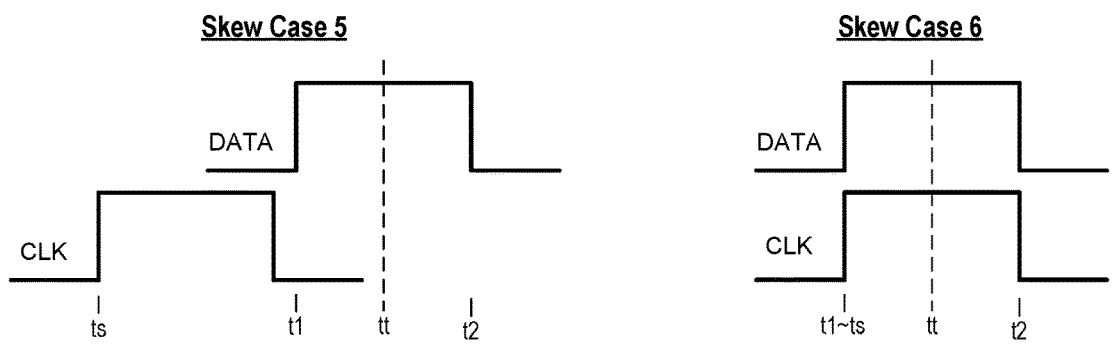
FIG. 3F
FIG. 3G

SKEW CORRECTION FOR SOURCE SYNCHRONOUS SYSTEMS

CROSS-REFERENCE TO RELATED APPLICATIONS

This application claims the benefit of U.S. Provisional Application No. 62/579,591, filed Oct. 31, 2017. The contents of U.S. Provisional Application No. 62/579,591 are incorporated by reference in their entirety.

BACKGROUND

In source synchronous systems, a sending circuit may send both a data signal carrying data and a clock signal to a receiving circuit. The receiving circuit may use the clock signal to identify the data values of the data carried by the data signal. In particular, the receiving circuit may determine when to identify levels of the data pulses in response to detecting transitions of the clock signal. Ideally, the clock transitions occur at optimal times that optimize the receiving circuit's ability to identify the correct levels of the data pulses. A deviation of the clock transitions from their optimal times may be referred to as skew between the clock signal and the data signal. Too large of skew between the data and clock signals may cause the receiving circuit to incorrectly identify the levels of the data pulses. Increases in frequency of the data and clock signals serve to magnify the problems that skew can have. Thus, as frequencies increase, processes that can correct for skew are increasingly important. At the same time, it is often desirable to communicate data from the sending circuit to the receiving circuit as quick as possible. Thus, efficient skew correction processes that require relatively small overhead may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 3A is a timing diagram of example waveforms of associated data and clock pulses, with a sampling transition of the clock pulse occurring at a target sampling time.

FIG. 3B is a timing diagram of example waveforms of associated data and clock pulses, with a sampling transition of the clock pulse occurring after a starting transition of the data pulse but before the target sampling time.

FIG. 3C is a timing diagram of example waveforms of associated data and clock pulses, with a sampling transition of the clock pulse occurring after an ending transition of the data pulse.

FIG. 3D is a timing diagram of example waveforms of associated data and clock pulses, with a sampling transition of the clock pulse occurring after the target sampling time but before an ending transition of the data pulse.

FIG. 3E is a timing diagram of example waveforms of associated data and clock pulses, with a sampling transition of the clock pulse occurring before a starting transition of the data pulse.

FIG. 3F is a timing diagram of example waveforms of associated data and clock pulses, with both a sampling transition and a next transition of the clock pulse occurring before a starting transition of the data pulse.

FIG. 3G is a timing diagram of example waveforms of associated data and clock pulses, with a sampling transition of the clock pulse occurring around the same time as the starting transition of the data pulse.

DETAILED DESCRIPTION

Overview

Figure 1:
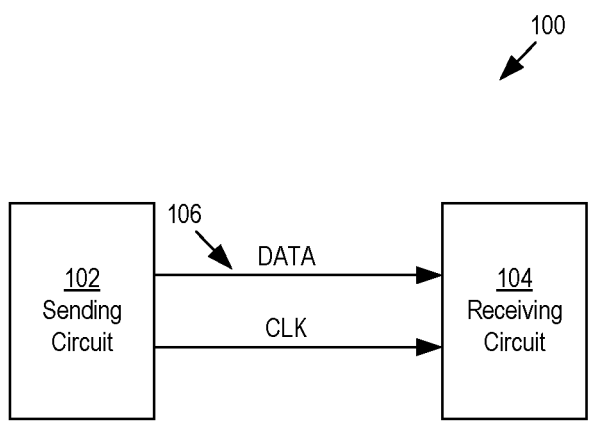
FIG. 1 is a block diagram of an example system that includes a sending circuit and a receiving circuit.

The following embodiments describe systems, apparatuses, devices, circuits, and methods for aligning clock signals and data signals. In one embodiment, a circuit includes an input circuit, a skew case identification circuit, and an output circuit. The input circuit is configured to receive an input data signal and an input clock signal. The skew case identification circuit is configured to identify a skew case from a plurality of predetermined skew cases for the input data signal and the input clock signal. The output circuit is configured to: delay the clock signal by a delay amount based on the selected skew case to output an output clock signal.

In some embodiments, a centering action selection circuit is configured to select a centering action from a plurality of centering actions, and the output circuit is configured to delay the clock signal based on the selected centering action.

In some embodiments, the plurality of centering actions includes a delay of the input data signal and a delay of the input clock signal.

In some embodiments, a position quantification circuit is configured to generate a plurality of position values, where each position value quantifies relative positions of transitions of the input data signal and the input clock signal.

In some embodiments, the position quantification circuit is further configured to measure a plurality of timing relationships between the transitions of the input data signal and the input clock signal to generate the plurality of position values.

In some embodiments, the position quantification circuit includes: a delay circuit configured to: delay a data pulse of the input data signal to generate delayed data pulses; delay a clock pulse of the input clock signal to generate delayed clock pulses; and a sense circuit configured to sense for presence or absence of the delayed data pulses and the delayed clock pulses in response to detection of transitions of an associated data pulse and an associated clock pulse, where each of the plurality of position values indicates a number delayed pulses sensed as being present at an associated time of sensing.

In some embodiments, a delay amount determination circuit is configured to determine the delay amount based on the selected skew case and the plurality of position values.

In some embodiments, the delay amount determination circuit is further configured to: select a function from a plurality functions based on the selected skew case, and input at least one of the plurality of position values to the selected function to determine the delay amount.

In some embodiments, a delay control circuit is configured to: receive an indication to delay the input clock signal, and in response to receipt of the indication, set a data delay to a non-delay value.

In some embodiments, the delay circuit is further configured to receive a second indication to delay the input data signal, and in response to receipt of the second indication signal, set a clock delay to the non-delay value.

In another embodiment, a circuit includes: an input circuit, a plurality of measurement circuits, a centering action circuit, and a centering circuit. The input circuit is configured to receive an input data signal and an input clock signal. The plurality of measurement circuits is configured to perform a plurality of timing relationship measurements for the input data signal and the input clock signal. Each measurement circuit, in order to perform a respective timing relationship measurement, is configured to: measure a different one of a plurality of timing relationships, each timing relationship corresponding to a different one of a plurality of permutations of transitions of the input data signal and the input clock signal. The centering action circuit is configured to select a centering action from a plurality of centering actions. The centering circuit is configured to center sampling transitions of the input clock signal relative to the input data signal to generate an output clock signal and an output data signal, where the centering is based on the timing relationship measurements and the selected centering action.

In some embodiments, the plurality of measurement circuits includes: a plurality of delay elements and a plurality of sets of sense circuit elements. Each delay element is configured to generate one of a plurality of delayed pulses. In addition, each set of sense circuit elements is configured to output an associated set of pulse presence signals, where each pulse presence signal is at a first level to indicate that an associated one of the delayed pulses was present at a respective input of an associated one of the sense circuit elements or absent at the respective input.

In some embodiments, a position value generation circuit is configured to generate a plurality of position values, where each position value corresponds to one of the timing relationship measurements.

In some embodiments, the transitions of the transition permutations comprise starting and ending transitions of the input data signal and starting and ending transitions of the input signal.

In some embodiments, the plurality of measurement circuits is configured to perform at least two of: a first timing relationship measurement that quantifies a position of a starting transition of a data pulse relative to a position of a starting transition of a clock pulse; a second timing relationship measurement that quantifies a position of a starting transition of a clock pulse relative to a position of an ending transition of a data pulse; a third timing relationship that quantifies a position of an ending transition of a data pulse relative to a position of a starting transition of a clock pulse; a fourth timing relationship measurement that quantifies a position of an ending transition of a clock pulse relative to a position of a starting transition of a data pulse; a fifth timing relationship measurement that quantifies a position of an ending transition of a data pulse relative to an ending transition of a clock pulse; or a sixth timing relationship that quantifies a position of a starting transition of a clock pulse relative to a position of a starting transition of a data pulse.

In some embodiments, the plurality of measurement circuits is configured to perform all six timing relationship measurements.

In another embodiment, a system includes: a memory array comprising a plurality of non-volatile memory cells, a memory interface, a centering action selection circuit, a delay circuit, a sense circuit, a position value generation circuit, a delay amount determination circuit, and an output circuit. The memory interface is in communication with a communications bus and is configured to receive a clock signal and a data signal to program data into the memory array. The centering action selection circuit is configured to output a centering action signal that indicates which of the data signal and the clock signal to delay. The delay circuit is configured to: delay a clock pulse of the clock signal to generate multiple delayed clock pulses, and delay a data pulse of the data signal to generate multiple delayed data pulses. The sense circuit is configured to: sense for a presence of the multiple delayed clock pulses present at a first set of inputs of the sense circuit at a first sensing time, and sense a second number of the multiple delayed data pulses present at a second set of inputs of the sense circuit at a second sensing time. The position value generation circuit is configured to output a first position value corresponding to the first number and a second position value corresponding to the second number. The delay amount determination circuit is configured to calculate a delay amount based on the first position value and the second position value. The output circuit is configured to: delay the clock signal by a clock delay amount corresponding to the delay amount or the data signal by a data delay amount corresponding to the delay amount and as indicated by the centering action signal, and output an output clock signal and an output data signal in response to the delay.

In some embodiments, a skew case identification circuit is configured to: analyze relative phases of the clock signal and the delay signal, and in response to the analysis, identify a skew case from a plurality of skew cases. The centering action selection circuit is configured to identify which of the data signal and the clock signal to delay in response to the identified skew case.

In some embodiments, the clock pulse that is delayed includes an initial clock pulse of the clock signal, and the data pulse that is delayed includes an initial data pulse of the data signal.

In some embodiments, the data pulse that is delayed includes a calibration data pulse of the data signal.

In some embodiments, a calibration circuit is configured to: identify at least one of a temperature or a level of a supply voltage; and in response to the identification, cause the output circuit to determine a new data delay amount and a new clock delay amount.

Other embodiments are possible, and each of the embodiments can be used alone or together in combination. Accordingly, various embodiments will now be described with reference to the attached drawings.

Embodiments

The following embodiments describe systems, apparatuses, devices, circuits, and methods for aligning clock signals and data signals using a clock/data alignment system. FIG. 1 shows a system 100 that includes a system in which one or more data/clock alignment circuits may be implemented. The system 100 may include a sending circuit 102 and a receiving circuit 104 configured to communicate with each other via a communications bus 106. In particular example configurations, both the sending circuit 102 and the receiver circuit 104 are transceiver circuits, each can be configured to transmit and receive signals. For simplicity, with reference to FIG. 1, one of the circuits 102 is designated as the circuit configured to send signals (i.e., the sending circuit 102) and the other circuit 104 is designated as the circuit configured to receive signals (i.e., the receiving circuit 104).

The sending circuit 102 is configured to send a clock signal CLK and a data signal DATA to the receiving circuit 104 via a communications bus 106. Otherwise stated, the receiving circuit 104 is configured to receive a clock signal CLK and a data signal DATA from the sending circuit 102 via the communications bus 106. In this context, the system 100 may be a source synchronous system, meaning that the sending circuit 102 outputs the data signal DATA according to a timing that is referenced to the clock signal CLK, and the receiving circuit 104 identifies the data values carried by the data signal DATA using the clock signal CLK received from the sending circuit 102.

In general, a signal, such as the clock signal CLK and the data signal DATA, may be at a level at a given point in time. As used herein, a level of a signal at a given point in time is a magnitude value, such as a voltage magnitude value or a current magnitude value. In some cases, the signal may be referred to as being at a high level or at a low level, transitioning between a high level and a low level, or transitioning between a low level and a high level. In general, a high level and a low level are both magnitude values, where the high level is higher in magnitude than the low level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

Additionally, for some example configurations, a given signal may transition between a high level and a low level according to a swing requirement that sets or identifies a minimum high level $V_{H\_MIN}$ and a maximum low level $V_{L\_MAX}$. A signal that transitions according to the swing requirement may transition to a high level that is at or above the minimum high level $V_{H\_MIN}$ of the swing requirement, and may transition to a low level that is at or below the maximum low level of the swing requirement.

In addition, a signal may perform a rising transition when the signal transitions from its low level to its high level, and may perform a falling transition when the signal transitions from its high level to its low level. A rising edge of a signal's waveform denotes a rising transition, and a falling edge of a signal's waveform denotes a falling transition.

Also, as used herein, a clock signal, such as the clock signal CLK, is a signal that has repetitive cycles occurring over successive periods T. Within each period T, a first portion of a respective cycle occurs first in time and a second portion of the respective cycle occurs second in time—i.e., after the first portion. After the second portion of one cycle occurs, the first portion of a next cycle occurs. Within a cycle, one of the portions is at a high level and the other portion is at a low level. Accordingly, the portions may be defined by consecutive rising and falling transitions or edges of the clock signal. For example, a given rising edge or a given falling edge may define or mark a boundary when one portion ends and a next portion, either of the same cycle or a next cycle, begins. In addition, a clock signal may include clock pulses, where, for each clock cycle, one of the portions is a clock pulse of the cycle. For some example configurations, a clock pulse includes and/or is defined by the portion of a cycle that is at the high level. Accordingly, a single clock pulse includes and/or is defined by a rising transition, a high-level portion of the clock signal immediately following the rising transition, and a falling transition immediately following the high-level portion. Other configurations that define clock pulses according to the low-level portions of the clock cycles may be possible. Herein, the terms starting transition and ending transition are used to refer to two transitions of a clock pulse in a cycle, where the starting transition occurs first in time and starts the clock pulse and the ending transition occurs second in time and ends the clock pulse. The starting transition of a clock pulse can be a rising transition or a falling transition, and the ending transition is the opposite of the starting transition. So, if the starting transition is a rising transition, then the ending transition is a falling transition. Conversely, if the starting transition is a falling transition, then the ending transition is a rising transition. Also, as described in further detail below, the rising transitions and/or the falling transitions of a clock signal may be sampling transitions. A sampling circuit that receives both a clock signal and a data signal may be configured to sample levels of the data signal in response to detection of the sampling transitions.

Additionally, as used herein, a data signal is a signal that carries and/or includes data. The data carried by and/or included in a data signal includes a bit sequence of bits, where each bit includes or has a single-bit logic value of "1" or "0". The data signal may include a series or sequence of data pulses corresponding to a bit sequence of the data, where each data pulse corresponds to one or more bits of the bit sequence. Accordingly, each data pulse may be at a level that corresponds to and/or indicates a data value, otherwise referred to as a logic level or a logic value, where each data value is represented by a binary number or a binary value that includes one or more digits corresponding to and/or representing the one or more bits of the bit sequence.

Figure 2:
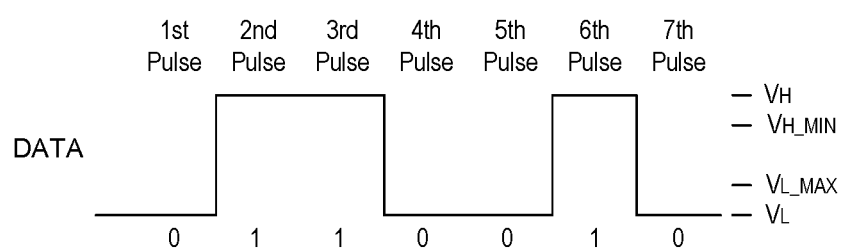
FIG. 2 is an example timing diagram of a waveform of a data signal.

FIG. 2 shows a timing diagram of at least a portion of an example data signal DATA that includes seven data pulses. Each data pulse is shown as being either at a high level at or above a minimum high level $V_{H\_MIN}$ or at a low level at or below a maximum low level $V_{L\_MAX}$. For the example data signal DATA in FIG. 2, the high level and the low level each indicate a single-bit logic value of "1" or "0", where the high level corresponds to and/or indicates a single-bit logic value of "1" (otherwise referred to as a logic 1 value) and the low level corresponds to and/or indicates a single-bit logic value of "0" (otherwise referred to as a logic 0 value). Other examples where different levels of data signal correspond to and/or indicate multi-bit logic values (i.e., logic values that each include two or more digits or bits) may be possible.

For two consecutive data pulses of the data signal DATA, where the two consecutive pulses correspond to different logic levels, the data signal DATA performs a rising transition or a falling transition to transition between the two consecutive data pulses. For the example shown in FIG. 2, where one pulse in the sequence corresponds to a logic 0 value and a next pulse in the sequence corresponds to a logic 1 value, the data signal DATA performs a rising transition to transition between the first and second pulses. On the other hand, where one pulse corresponds to a logic 1 value and a next pulse corresponds to a logic 0 value, the data signal DATA performs a falling transition to transition between the first and second pulses. Conversely, where the two consecutive pulses correspond to the same logic level, then as the pulse sequence transitions from one pulse to a next pulse, the level of the data signal DATA stays the same during those two pulses, and a rising transition or a falling transition may not occur. Regardless of whether a change in level of the data signal DATA occurs when transitioning between two consecutive data pulses, the start of a given data pulse is referred to as a starting transition of the data pulse, and the end of a given data pulse is referred to as an ending transition of the data pulse.

Referring back to FIG. 1, the receiving circuit 104 may include sampling circuitry that samples the levels of the data signal DATA in order to identify the logic values of the data carried by the data signal. The receiving circuit 104 may determine when to sample the levels according to the clock signal CLK, and in particular according to rising and/or falling transitions of the clock signal CLK. The transitions of a clock signal that sampling circuitry uses to sample a data signal are referred to as sampling transitions of the clock signal. In some example configurations, including single data rate (SDR) configurations, only the rising transitions or only the falling transitions of a clock signal are sampling transitions. For other example configurations, including double data rate (DDR) configurations, both the rising transitions and the falling transitions of a clock signal are sampling transitions.

The sending circuit 102 may send the clock signal CLK and the data signal DATA such that each data pulse of the data signal DATA corresponds to and/or is associated with an associated sampling transition of the clock signal CLK. This way, when the sampling circuitry of the receiving circuit 104 receives the clock signal CLK and the data signal DAT, the sampling circuitry samples each data pulse in response to identifying each of the associated sampling transitions.

Ideally, the sampling circuitry receives the clock signal CLK and the data signal DATA relative to each other such that the sampling circuitry accurately samples the level of each data pulse in order to correctly identify the logic value to which each data pulse corresponds. Configuring the sampling circuitry to sample each data pulse in the middle or at a middle point of the duration of each pulse may maximize the chances of this ideal situation to occur. The ideal time at which to sample a data pulse may be referred to as a target sampling time of the data pulse. Ideally, then, for each data pulse, the sampling circuitry will identify an associated sampling transition in the middle of the duration of the associated data pulse and/or at the target sampling time. For a given sampling transition or a clock pulse that includes the given sampling transition, the given sampling transition or clock pulse is in a target sampling position when the sampling transition occurs at the target sampling time of its associated data pulse.

FIG. 3A shows a data pulse of the data signal DATA and a pulse of the clock signal CLK, illustrating the ideal case where a sampling transition of the clock pulse is in the target sampling position. In FIG. 3A, a starting transition of the data pulse occurs at a first time t1, and an ending transition of the data pulse occurs at a second time t2. A target sampling time tt of the data pulse occurs in the middle between the first time t1 and the second time t2. Accordingly, a first time period T1 extending from the first time t1 to the target sampling time tt is the same as or equal to a second time period T2 extending from the target sampling time tt to the second time t2. Additionally, the sampling transition associated with the data pulse is the rising transition of the clock pulse. The sampling transition occurs at a sampling time ts. In FIG. 3A, for the ideal case, the sampling transition occurs at the target sampling time—i.e., the sampling time ts and the target sampling time tt are the same.

In actuality, the sampling circuitry 104 of the receiving circuit 104 may not receive the clock pulses in their respective target sampling positions. Various reasons may cause this to happen, such as imperfections in the alignment and transmission of the clock and data signals by the sending circuit 102, differences in propagation delay in the lines of the communications bus 106, or process-voltage-temperature (PVT) fluctuations, as non-limiting examples. A deviation of a sampling transition of a clock signal from the target sampling position and/or a deviation of the sampling time ts from the target sampling time tt may be referred to as skew between a data pulse and an associated clock pulse, or more generally between a data signal DATA and the clock signal CLK used for sampling the data pulses of the data signal DATA. The amount of skew may be quantified by the difference in time between the sampling time ts and the target sampling time tt.

FIGS. 3B-3G illustrate various different ways that skew may exist between associated data pulses and clock pulses. FIG. 3B illustrates a first skew case, where the sampling transition at the sampling time ts occurs after the starting transition of the data pulse occurs but earlier than the target sampling time tt. FIG. 3C illustrates a second skew case, where the sampling transition at the sampling time ts occurs later than the target sampling time tt and after the ending transition of the data pulse occurs. The second skew case may cause the sampling circuitry to incorrectly sample the next data pulse instead of the data pulse with which the sampling transition is associated. FIG. 3D illustrates a third skew case, where the sampling transition at the sampling time ts occurs later than the target sampling time tt, but before the ending transition of the data pulse occurs. FIG. 3E illustrates a fourth skew case where the sampling transition at the sampling time ts occurs earlier than the target sampling time tt and before the starting transition of the data pulse occurs. The fourth skew case may cause the sampling circuitry to incorrectly sample the previous data pulse instead of the data pulse with which the sampling transition is associated. FIG. 3F illustrates a fifth skew case where the sampling transition at the sampling time ts occurs earlier than the target sampling time tt and before the starting transition of the data pulse occurs, and where a next clock transition of the clock signal CLK that immediately follows the sampling transition occurs before the starting transition of the data pulse. FIG. 3G illustrates a sixth skew case where the sampling transition at the sampling time is occurs at or very close to the starting transition of the data pulse.

For some example configurations, the sampling circuitry of the receiving circuit 104 may be configured with a certain setup and hold requirement in order for the sampling circuitry to accurately identify the levels of the data pulses. Receipt of the data signal DATA and the clock signal CLK in the ideal sampling position may provide the largest sample and hold window, and thus best position the sampling circuitry to accurately capture the voltage levels of the data pulses. On the other hand, too large of skew between the clock signal CLK and the data signal DATA, such as in accordance with the skew cases identified with respect to FIGS. 3B-3G, may fail to meet the sample and hold requirements of the sampling circuitry, and in turn cause the sampling circuitry to inaccurately identify the levels of the data pulses.

Figure 4:
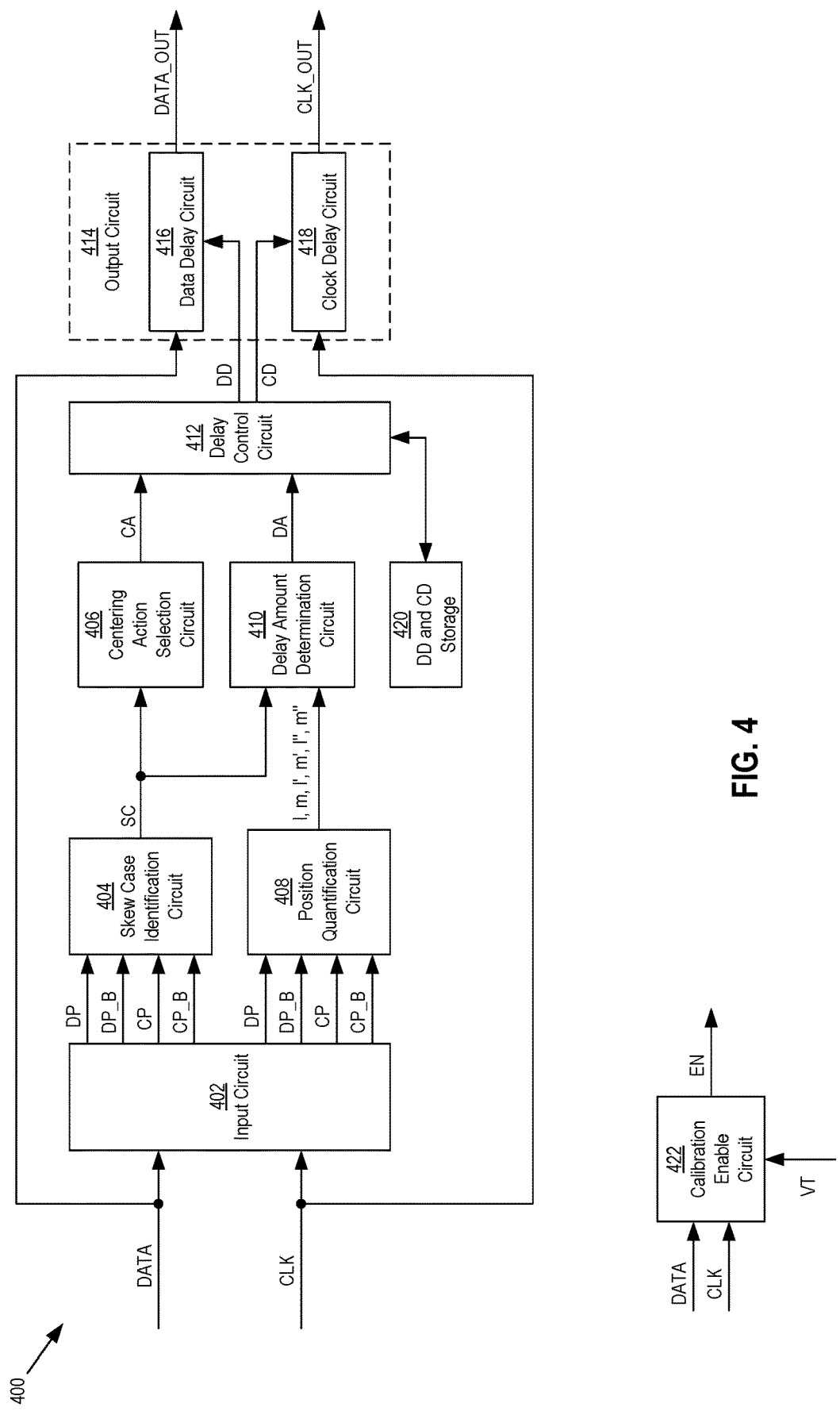
FIG. 4 is a block diagram of a skew correction system of the clock receiving circuit of FIG. 1.

FIG. 4 shows a block diagram of an example skew correction system 400 configured perform a skew correction process to correct for skew between a clock signal CLK and a data signal DATA. The skew correction system 400 may correct for skew by determining how to temporally adjust or delay the clock signal CLK or the data signal DATA so that clock pulses of the clock signal CLK are in target sampling positions.

As described in further detail below, the skew correction system 400 may be configured to receive an input data signal DATA and an input clock signal CLK, and select a skew case from a plurality of predetermined skew cases for the input data signal DATA and the input clock signal CLK. The predetermined skew cases may correspond to the skew cases identified in FIGS. 3B-3G. The skew correction system 400 may be configured to delay the data signal DATA or the clock signal CLK by a delay amount that is dependent on the selected skew case. The skew correction system 400 may output an output data signal DATA_OUT and an output clock signal CLK_OUT corresponding to the delay.

In addition, based on the identified skew case, the skew correction system 400 may determine or select one of a plurality of centering actions, where each centering action include a delay of the clock signal CLK or a delay of the data signal DATA. The delay of the clock signal CLK and the delay of the data signal DATA are referred to as centering actions in that the delay may cause the sampling transitions of the clock signal CLK to occur at respective target sampling times—i.e., in the middle or at the center between the starting transitions and the ending transitions of their associated data pulses. The delay of the data signal DATA or the clock signal CLK may depend on and/or correspond to the selected centering action.

In addition, the skew correction system 400 may be configured to perform a plurality of timing relationship measurements for the clock signal CLK and the data signal DATA by measuring timing relationships between transitions of pulses of the clock signal CLK and the data signal DATA. In general, a timing relationship between a first transition and a second transition indicates when the first transition occurs relative to the occurrence of the second transition. When the first transition occurs relative to when the second transition occurs is referred to as a position or a temporal position of the first transition relative to a position of the second transition. Accordingly, a timing relationship measurement is a measurement or a quantification of the position of the first transition relative to the position of the second transition.

In particular example configurations, a timing relationship between a first transition and a second transition indicates an occurrence of the first transition ahead of or in advance of the occurrence of the second transition. For such example configurations, a position of a first transition relative to a position of a second transition is a position of the first transition ahead or in advance of a position of the second transition, and a timing relationship measurement may be a measurement or a quantification of how far ahead or in advance the first transition occurs relative to the second transition.

In order to perform the plurality of timing relationship measurements, the skew correction system 400 may be configured to measure a plurality of timing relationships, where each timing relationship is measured for and/or corresponds to a different one of a plurality of transition permutations of the data signal DATA and the clock signal CLK. As used herein, a transition permutation is an ordered combination of two different transitions of two different pulses, where one of the pulses is a clock pulse and the other pulse is a data pulse. For each transition permutation, the two different transitions may include a first transition and a second transition, where the first transition and the second transition are each a starting transition of the clock signal, an ending transition of the clock signal, a starting transition of the data signal, or an ending transition of the data signal. Also, for each permutation, the two different pulses are associated with each other, meaning that for a given permutation that includes a given clock pulse and a given data pulse, the given clock pulse is the one that is used by the sampling circuitry to sample the given data pulse. A clock pulse and a data pulse that are associated with each other may be referred to as a pair of associated clock and data pulses. Additionally, as described in further detail below, the skew correction system 400 may measure the plurality of timing relationships using a single pair of associated clock and data pulses or a plurality of pairs of associated clock and data pulses. For particular example configurations, the skew correction system 400 may use the first or initial data pulse of the data signal DATA and the first or initial clock pulse of the clock signal CLK to measure at least one timing relationship for at least one of the transition permutations.

Also, for each transition permutation that includes a given first transition and a given second transition, by measuring a timing relationship corresponding to the transition permutation, the skew correction system 400 may be configured to quantify the position of the given first transition relative to the given second transition. Accordingly, in response to performing the timing relationship measurements, the skew correction system 400 may be configured to determine and/or generate a plurality of position values, where each position value corresponds to a respective one of the plurality of transition permutations, and where each position value quantifies a position of a first transition of a corresponding transition permutation relative to a position of a second transition of the corresponding transition permutation. In particular example configurations, each position value quantifies how far ahead or in advance the first transition occurs relative to the second position, or otherwise stated, how far ahead or in advance the position of the first transition is relative to the second position.

For at least some example configurations, each position value is a number of units of measurement. A unit of measurement may be a unit of time or a unit of phase.

Also, in response to selecting a centering action, the skew correction system 400 may perform the selected centering action, such as by delaying either the clock signal CLK or the data signal DATA. The amount that the skew correction system 400 delays the clock signal CLK or the data signal DATA may depend on the position values.

In further detail, the skew correction system 400 may include an input circuit 402, a skew case identification circuit 404, a centering action selection circuit 406, a position quantification circuit 408, delay amount determination circuit 410, a delay control circuit 412, and an output circuit 414. Each of the circuit components may be implemented in hardware or a combination of hardware and software to perform its functions or actions. For at least some example configurations where a circuit includes a combination of hardware and software, the circuit may include a processor configured to execute the software, which may be stored in a memory.

The input circuit 402 may be configured to receive the clock signal CLK and the data signal DATA from the sending circuit 102 via the communications bus 106. The clock signal CLK may be considered or referred to as an input clock signal of the skew correction system 400. Likewise, the data signal DATA may considered or referred to as an input data signal of the skew correction system 400.

As shown in FIG. 4, the input circuit 402 may be considered to route or output at least one clock pulse CP of the clock signal CLK and at least one data pulse DP of the data signal DATA to each of the skew case identification circuit 404 and the position quantification circuit 408. As described in further detail below, each of the skew case identification circuit 404 and the position quantification circuit 408 may use one or more of the data pulses DP and one or more of the clock pulses CP to perform their respective operations. For some example configurations, the input circuit 402 may output the entire data signal DATA and/or the entire clock signal CLK to the skew case identification circuit 404 and the position quantification circuit 408, and those circuits 404, 408 may be configured to perform their respective operations using all or less than all of the clock and data pulses CP, DP. In other example configurations, the input circuit 402 may send only those clock pulses and data pulses CP, DP that the skew case identification circuit 404 and the position quantification circuit 408 need to perform their respective operations. Various ways of communicating all or less than all of the data pulses DP and the clock pulses CP to the skew case identification circuit 404 and the position quantification circuit 408 may be possible.

Also, as described in further detail below, the skew case identification circuit 404 and the position quantification circuit 408 may each perform their respective operations by analyzing both the starting transitions and the ending transitions of the clock pulses CP and the data pulses DP. For a given pulse, one of the transitions may be a rising transition and the other transition may be a falling transition. For some example configurations, the circuit components of the skew case identification circuit 404 and/or the position quantification circuit 408 may be configured to analyze only one of the transitions—that is, only rising transitions or only falling transitions. In order for both the starting transitions and the ending transitions to be analyzed, the clock pulses CP and the data pulses DP may be inverted to generate inverted or complementary clock pulses CP_B and inverted or complementary data pulses DP_B. The starting and ending transitions of complementary clock pulses CP_B respectively correspond to the ending and starting transitions of the clock pulses CP. Similarly, the starting and ending transitions of complementary data pulses DP_B, respectively correspond to ending and starting transitions of the data pulses DP.

For configurations where the circuit components of the skew case identification circuit 404 and/or the position quantification circuit 408 are able to analyze starting transitions but not ending transitions, generating complementary clock pulses CP_B and complementary data pulses DP_B, and causing the circuit components to analyze the starting transitions of the clock and data pulses CP, DP and the starting transitions of the complementary clock and data pulses CP_B, DP_B, will effectively allow the circuit components to analyze both the starting and ending transitions of the clock and data pulses CP, DP. Similarly, for configurations where the circuit components of the skew case identification circuit 404 and/or the position quantification circuit 408 are able to analyze ending transitions but not starting transitions, generating complementary clock pulses CP_B and complementary data pulses DP_B, and causing the circuit components to analyze the ending transitions of the clock and data pulses CP, DP and the ending transitions of the complementary clock and data pulses CP_B, DP_B, will effectively allow the circuit components to analyze both the starting and ending transitions of the clock and data pulses CP, DP.

The signal comprising the complementary clock pulses CP_B is referred to as an inverted or a complementary clock signal CLK_B, and the signal comprising the complementary data pulses DP_B is referred to as an inverted or a complementary data signal DATA_B. As used herein, two signals or two pulses are complementary in that when one of the signals or pulses is at an associated high level the other is at an associated low level. The waveforms of two complementary signals or pulses are considered to be inverted versions of each other and/or inversely track each other in that when one signal or pulse performs a rising transition, the other signal or pulse performs a falling transition. In addition or alternatively, two signals or pulses that are complementary are 180-degrees out of phase with each other or have waveforms representative of two signals or pulses that are 180-degrees out of phase with each other. For a pair of complementary signals or pulses, when a first signal or pulse of the pair is performing a rising transition, a second signal or pulse of the pair is performing a falling transition, or in the event that the rising and falling transitions are not occurring concurrently, then the transition of the second signal or pulse that is occurring closest in time to the rising transition of the first signal or pulse is a falling transition. Similarly, when the first signal or pulse of the pair is performing a falling transition, the second signal or pulse is performing a rising transition, or in the event that the rising and falling transitions are not occurring concurrently, then the transition of the second signal that is occurring closest in time to the falling transition of the first signal is a rising transition. A rising edge of a signal's waveform denotes a rising transition, and a falling edge of a signal's waveform denotes a falling transition.

In some example configurations, the input circuit 402 may itself generate the complementary data pulses DP_B and the complementary clock pulses CP_B. That is, the sending circuit 102 sends only the clock signal CLK and the data signal DATA, and the input circuit 402 generates the complementary clock pulses CP_B and the complementary data pulses DP_B in response to receipt of the clock signal CLK and the data signal DATA. In other example configurations, the sending circuit 102 sends both the clock signal CLK and the complementary clock signal CLK_B, and sends both the data signal DATA and the complementary data signal DATA_B. For these other configurations, the input circuit 402 may be configured to receive the clock signal CLK, the complementary clock signal CLK_B, the data signal DATA, and the complementary data signal DATA_B from the sending circuit 102, and in response output one or more clock pulses CP, one or more complementary clock pulses CP_B, one or more data pulses DP, and one or more complementary data pulses DP_B to the skew case identification circuit 404 and the position quantification circuit 408. Various ways of configuring the sending circuit 102 and the input circuit 402 of the receiving circuit 104 so that the skew case identification circuit 404 and the position quantification circuit 408 receive one or more pairs of complementary data pulses DP, DP_B and one or more pairs of complementary clock pulses CP, CP_B corresponding to the data signal DATA and the clock signal CLK may be possible.

As previously described with respect to FIGS. 3B-3G, skew between a data pulse and an associated clock pulse may fall into one of six skew cases. The skew case identification circuit 404 may be configured to receive at least one data pulse DP of the data signal DATA and at least one associated clock pulse CP of the clock signal CLK. In response to receipt of the data pulse DP and the associated clock pulse CP, the skew case identification circuit 404 may be configured to identify a skew case from a plurality of predetermined skew cases that the data pulse DP and the associated clock pulse CP are exhibiting. The predetermined skew cases may correspond to the six skew cases described with reference to FIGS. 3B-3G.

The skew case identification circuit 404 may be implemented in various ways. In one example configuration, the skew case identification circuit 404 may include a phase detection circuit that is configured to analyze relative phases or phase differences of the clock signal CLK and the data signal DATA. The phase detection circuit may do so by analyzing relative phases or phase differences between at least one clock pulse CP and at least one data pulse DP, between at least one clock pulse CP and at least one complementary data pulse DP_B, between at least one complementary clock pulse CP_B and at least one data pulse DP, and/or between at least one complementary clock pulse CP_B and at least one complementary data pulse DP_B. Based on the relative phases or phase differences determined by the phase detection circuit, the skew case identification circuit 404 may be configured to identify one of the six skew cases. Upon identifying a skew case, the skew case identification circuit 404 may be configured to output a skew case indication signal SC that indicates which of the plurality of skew cases it identified.

The centering action selection circuit 406 may be configured to receive the skew case indication signal SC. In response to receipt, the centering action selection circuit 406 may be configured determine which of the data signal DATA and the clock signal CLK to delay, and in response to the determination, select one of a plurality of centering actions for the output circuit 414 to perform on the data signal DATA or the clock signal CLK. As previously described, a centering action may be a delay of the data signal DATA or a delay of the clock signal CLK. The delaying is referred to as a centering action in that whether the delaying involves delaying the data signal DATA or the clock signal CLK, the delay has the effect of centering the sampling transitions of the clock pulses in the middle of the durations of their associated date pulses.

The centering action selection circuit 406 may then determine whether to delay the clock signal CLK or the data signal DATA based which of the six skew cases it identified. In particular example configurations, the centering action selection circuit 406 may select to delay the clock signal CLK for skew cases where the sampling transition of the clock pulse occurs earlier than the target sampling time, and may select to delay the data signal DATA for skew cases where the sampling transition of the clock pulse occurs later than the target sampling time. So, with reference to FIGS. 3B-3G, the centering action selection circuit 406 may determine to delay the clock signal CLK for skew cases one, four, five, and six, and may determine to delay the data signal DATA for skew cases two and three. In the event that the centering action selection circuit 406 determines that there is no skew between the data pulse and the associated clock pulse—i.e., that the clock pulse is in the target sampling position—then the centering action selection circuit 406 may determine a centering action that includes delaying neither the data signal DATA nor the clock signal CLK.

As shown in FIG. 4, the centering action selection circuit 406 may be configured to output a centering action signal CA that indicates the centering action that the centering action selection circuit 406 selected and/or which of the clock signal and the data signal to delay. As described in further detail below, the delay control circuit 412 may receive the centering action signal CA, and in response, delay the data signal DATA, delay the clock signal CLK, or delay neither the data signal DATA nor the clock signal CLK according to the indication of the centering action signal CA.

The position quantification circuit 408 may be configured to perform a plurality of timing relationship measurements for the clock signal CLK and the data signal DATA by measuring timing relationships between transitions of one or more clock pulses CP of the clock signal CLK and one or more data pulses DP of the data signal DATA. In particular, the position quantification circuit 408 may be configured measure timing relationships for a plurality of permutations of transitions or edges of the data signal DATA and the clock signal CLK. For a given permutation that includes a given first transition and a given second transition, the position quantification circuit 408 is configured to measure a corresponding timing relationship for the given permutation in order to quantify a position of the given first transition relative to a position of the given second transition. Accordingly, in response to performing the plurality of timing relationship measurements, the position quantification circuit 408 may be configured to generate a plurality of position values, where each position value quantifies or indicates a quantification of an associated timing relationship of two transitions of the clock signal CLK and the data signal DATA with respect to corresponding transition permutations.

In an example configuration as described herein, the plurality of transition permutations for which position quantification circuit 408 performs timing relationship measurements includes six transition permutations, where each of the six permutations includes or has an associated first transition of a first pulse and an associated second transition of a second pulse. For each of the six transition permutations, the associated first transition and the associated second transition can each be either a starting transition or an ending transition, and the first pulse and the second pulse can be either a clock pulse CP or a data pulse DP. In the example configuration as described herein, the six transition permutations are described as follows.

A first transition permutation includes a starting transition of a data pulse as its first transition and a starting transition of an associated clock pulse as its second transition. A measurement of a first timing relationship corresponding to the first transition permutation quantifies a position of the starting transition of the data pulse relative to a position of the starting transition of the clock pulse.

A second transition permutation includes a starting transition of a clock pulse as its first transition and an ending transition of an associated data pulse as its second transition. A measurement of a second timing relationship corresponding to the second transition permutation quantifies a position of the starting transition of the clock pulse relative to a position of the ending transition of the data pulse.

A third transition permutation includes an ending transition of a data pulse as its first transition and a starting transition of an associated clock pulse as its second transition. A measurement of a third timing relationship corresponding to the third transition permutation quantifies a position of the ending transition of the data pulse relative to a position of the starting transition of the clock pulse.

A fourth transition permutation includes an ending transition of a clock pulse as its first transition and a starting transition of an associated data pulse as its second transition. A measurement of a fourth timing relationship corresponding to the fourth transition permutation quantifies a position of the ending transition of the clock pulse relative to the position of the starting transition of the data pulse.

A fifth transition permutation includes an ending transition of a data pulse as its first transition and an ending transition of an associated clock pulse as its second transition. A measurement of a fifth timing relationship corresponding to the fifth transition permutation quantifies a position of the ending transition of the data pulse relative to the position of the ending transition of the clock pulse.

A sixth transition permutation includes a starting transition of a clock pulse as its first transition and a starting transition of an associated data pulse as its second transition. A measurement of a sixth timing relationship corresponding to the sixth transition permutation quantifies a position of the starting transition of the clock pulse relative to the position of the starting transition of the data pulse.

Figure 5:
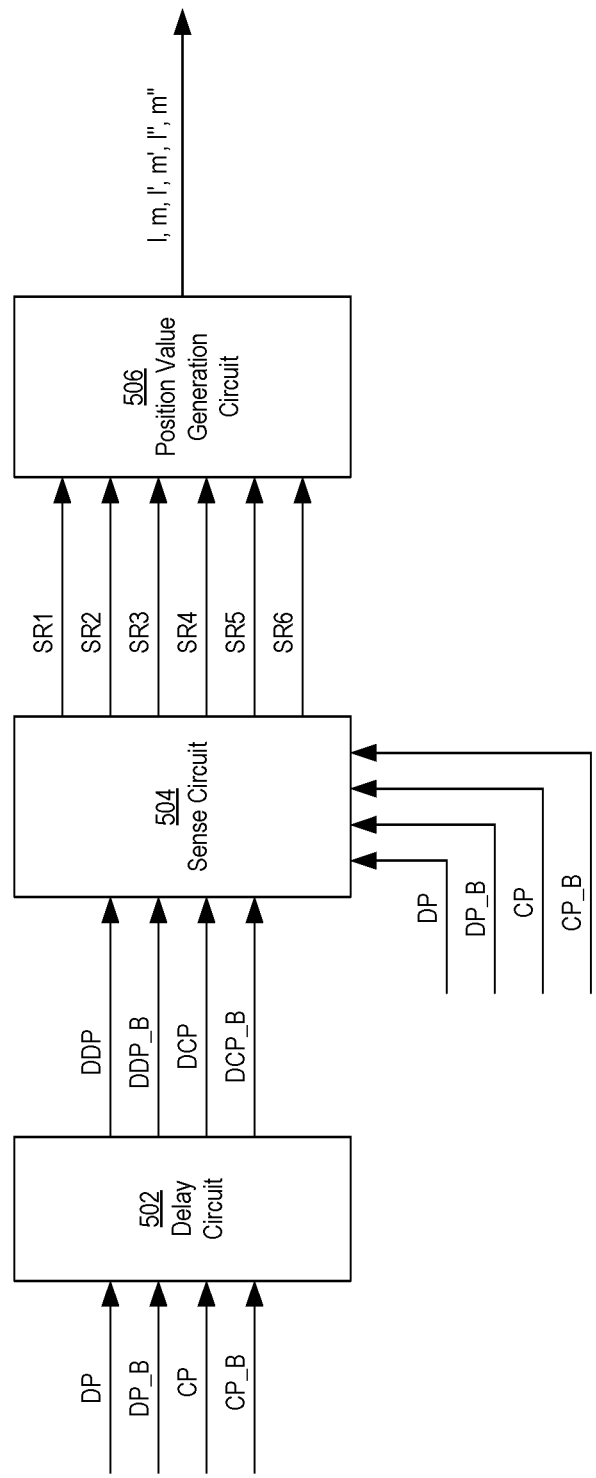
FIG. 5 is a block diagram of an example configuration of a position quantification circuit of FIG. 4, including a delay circuit, a sense circuit, and a position value generation circuit.

FIG. 5 is a block diagram of an example configuration of the position quantification circuit 408. As shown in FIG. 5, the position quantification circuit 408 may include a delay circuit 502, a sense circuit 504, and a position value generation circuit 506. In general, the delay circuit 502 may be configured to delay at least one clock pulse CP to generate multiple delayed clock pulses DCP, and to delay at least one data pulse to generate multiple delayed data pulses DDP. The sense circuit 504 may include a plurality or sets of inputs to receive the delayed data pulses. In addition, the sense circuit 504 may perform sensing actions to sense for the presence or absence of the multiple delayed clock pulses DCP at a first set of inputs. The sense circuit 504 may perform the sense actions at a first sensing time that occurs when the sense circuit 504 detects a transition of a data pulse DP. The sense circuit 504 may also sense for the presence or absence of the multiple delayed data pulses DDP at a second set of inputs. The sense circuit 504 may perform the sense actions at a second sensing time that occurs when the sense circuit 504 detects a transition of the clock pulse CP. For each transition permutation, the sense circuit 504, in response to the sensing, may identify a number of associated delayed pulses that were present at a sensing time, which in turn may indicate or quantify a position of a first signal relative to a second signal associated with the given permutation. For each transition permutation, the sense circuit 504 may output an associated sense result signal SR that indicates the number of associated delayed pulses that were present at the sensing time. The position value generation circuit 506 may be configured to receive the sense result signals SR, identify the numbers of associated delayed pulses indicated in the sense result signals SR, and output associated position values PV set to or otherwise indicating the numbers.

In further detail, the delay circuit 502 is configured to delay at least one clock pulse CP of the clock signal CLK to generate multiple delayed clock pulses DCP and at least one data pulse DP of the data signal DATA to generate multiple delayed data pulses DDP. Each starting transition of a delayed clock pulse DCP may have a certain delay relative to the starting transition of the clock pulse CP. In addition, each ending transition of a delayed clock pulse DCP may have a certain delay relative to the ending transition of the clock pulse CP. Similarly, each delayed data pulse DDP may have a certain delay relative to the starting transition of the data pulse DP. In addition, each delayed data pulse DDP may have a certain delay relative to the ending transition of the data pulse DP. The delay circuit 502 may output the multiple delayed clock pulses DCP and the multiple delayed data pulses DDP to the sense circuit 504.

The sense circuit 504 may be configured to perform sensing actions to sense for the presence or absence of delayed data pulses. For a given timing relationship measurement corresponding to a given transition permutation that includes a first transition of a first pulse and a second transition of a second pulse, the sense circuit 504 may be configured to perform a plurality of sensing actions to sense for the presence or absence of delayed pulses associated with the first transition of the first pulse that it receives from the delay circuit 502 on or in response to detecting a transition of a pulse associated with the second transition of the second pulse.

As described in further detail below, for each sensing action performed, the sense circuit 504 may be configured to generate a pulse presence signal PP at either a first level that indicates that an associated delayed pulse was present at the time of sensing, or at a second level that indicates the associated delayed pulse was not present (or was absent) at the time of the sensing. In response to generation of the pulse presence signals PP, the sensing circuit 504 may be configured to output sense result signals SR, each corresponding to one of the timing relationship measurements and an associated one of the transition permutations.

Each sense result signal SR may indicate a number of times that delayed pulses associated with a given timing relationship measurement and associated transition permutation were present at a time of sensing. As used herein, the number of times that the sense circuit 504 determines that delayed pulses associated with a given timing relationship measurement and associated transition permutation were present at the time of sensing is referred to as a pulse presence number.

For a given ith sense result signal SRi corresponding to a given transition permutation that includes an associated first transition of a first pulse and an associated second transition of a second pulse, the pulse presence number indicated by the given ith sense result signal SRi may indicate a quantification of a position of the first transition of the first pulse relative to a position of the second transition. In particular, the pulse presence number indicated by the given ith sample result signal SRi may be an indication of how many delay units the delay circuit 502 delayed the first pulse in order for the sense circuit 504 to identify the delayed pulse as not being present (or being absent) at the time it sensed for the presence or absence of the delayed pulse. That number of delay units, in turn, indicates a number of units that the first transition of the first pulse is ahead of or in advance of the second transition of the second pulse of the corresponding transition permutation.

For some example configurations, the sense circuit 504 may be configured to sense that delayed pulses are present at the time of sensing if the sense circuit 504 senses or detects high levels, and may sense that delayed pulses are not present at the time of sensing if the sense circuit 504 senses or detects low levels. Additionally, for some example configurations, the sense circuit 504 may be configured to sense on or in response to detection of starting transitions but not on or in response to detection of ending transitions. For such sense circuit configurations, the delay circuit 502 may be configured to delay at least one complementary data pulse DP_B to generate and output delayed complementary data pulses DDP_B, and to delay at least one complementary clock pulse CP_B to generate and output delayed complementary clock pulses DCP_B. The sense circuit 504 may receive the delayed complementary clock and data pulses DDP_B, DCP_B, along with the at least one complementary data pulse DP_B and the at least one complementary clock pulse CP_B directly from the input circuit 402 in order to quantify positions for all of the transition permutations.

Figure 6:
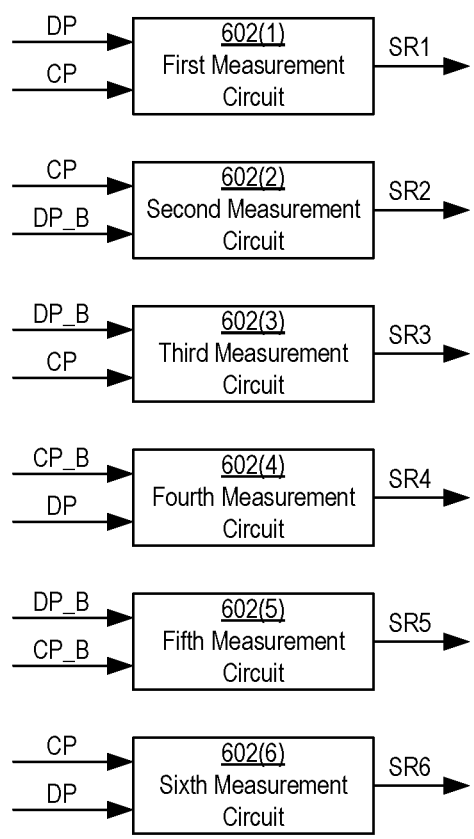
FIG. 6 is a block diagram of an example arrangement of components of the delay circuit and the sense circuit into a plurality of measurement circuits.

Referring to FIG. 6, the circuit components of the delay circuit 502 and the sense circuit 504 may be organized or arranged into a plurality of measurement circuits 602. Each measurement circuit 602 may be configured to perform one of the timing relationship measurements for a corresponding one of the transition permutations. In addition, each ith measurement circuit may be configured to generate an associated ith sense result signal SRi and output the ith sense result signal SRi to the position value generation circuit 506 (FIG. 5).

In accordance with the six timing relationship measurements for the six transition permutations identified above, each measurement circuit 602 is configured to perform one of the six timing relationship measurements for a corresponding one of the six transition permutations. In particular, a first measurement circuit 602(1) is configured to perform the first timing relationship measurement for the first transition permutation; a second measurement circuit 602(2) is configured to perform the second timing relationship measurement for the second transition permutation; a third measurement circuit 602(3) is configured to perform the third timing relationship measurement for the third transition permutation; a fourth measurement circuit 602(4) is configured to perform the fourth timing relationship measurement for the fourth transition permutation; a fifth measurement circuit 602(5) is configured to perform the fifth timing relationship measurement for the fifth transition permutation; and a sixth measurement circuit 502(6) is configured to perform the sixth timing relationship measurement for the sixth transition permutation.

Additionally, the measurement circuits 602 may be configured to sense that delayed pulses are present at the time of sensing in response to detecting high levels, and to sense on or in response to detection of starting transitions but not on or in response to detection of ending transitions. As such, those measurement circuits 602 configured to perform a timing relationship measurement that includes an ending transition of a signal may receive a data pulse of the complement of that signal. So, for example, the second measurement circuit 602(2) may receive the complementary data pulse DP_B instead of the data pulse DP in order to perform the second timing relationship measurement involving the ending transition of the data pulse.

In further detail, for the first timing relationship measurement corresponding to the first transition permutation that includes a starting transition of a data pulse DP as its first transition and a starting transition of an associated clock pulse CP as its second transition, the first measurement circuit 602(1) may perform the first timing relationship measurement in response to receipt of the data pulse DP and the clock pulse CP. In addition, the first measurement circuit 602(1) may output a first sense result signal SR1 indicating a number of delayed data pulses DDP it sensed as being present at the time it detected the starting transition of the clock pulse CP.

For the second timing relationship measurement corresponding to the second transition permutation that includes a starting transition of a clock pulse CP as its first transition and an ending transition of an associated data pulse DP as its second transition, the second measurement circuit 602(2) may perform the second timing relationship measurement in response to receipt of the clock pulse CP and the complementary data pulse DP_B. In addition, the second measurement circuit 602(2) may output a second sense result signal SR2 indicating a number of delayed clock pulses DCP it sensed as being present at the time it detected the starting transition of the complementary data pulse DP_B.

For the third timing relationship measurement corresponding to the third transition permutation that includes an ending transition of a data pulse DP as its first transition and a starting transition of an associated clock pulse CP as its second transition, the third measurement circuit 602(3) may perform the third timing relationship measurement in response to receipt of the complementary data pulse DP_B and the clock pulse CP. In addition, the third measurement circuit 602(3) may output a third sense result signal SR3 indicating a number of delayed complementary data pulses DDP_B it sensed as being present at the time it detected the starting transition of the clock pulse CP.

For the fourth timing relationship measurement corresponding to the fourth transition permutation that includes an ending transition of a clock pulse CP as its first transition and a starting transition of an associated data pulse DP as its second transition, the fourth measurement circuit 602(4) may perform the fourth timing relationship measurement in response to receipt of the complementary clock pulse CP_B and the data pulse DP. In addition, the fourth measurement circuit 602(4) may output a fourth sense result signal SR4 indicating a number of delayed complementary clock pulses DCP_B it sensed as being present at the time it detected the starting transition of the data pulse DP.

For the fifth timing relationship measurement corresponding to the fifth transition permutation that includes an ending transition of a data pulse DP as its first transition and a ending transition of an associated clock pulse CP as its second transition, the fifth measurement circuit 602(5) may perform the fifth timing relationship measurement in response to receipt of the complementary data pulse DP_B and the complementary clock pulse CP_B. In addition, the fifth measurement circuit 602(5) may output a fifth sense result signal SR5 indicating a number of delayed complementary data pulses DDP_B it sensed as being present at the time it detected the starting transition of the complementary clock pulse CP_B.

For the sixth timing relationship measurement corresponding to the sixth transition permutation that includes a starting transition of a clock pulse CP as its first transition and a starting transition of an associated data pulse DP as its second transition, the sixth measurement circuit 602(6) may perform the sixth timing relationship measurement in response to receipt of the clock pulse CP and the data pulse DP. In addition, the sixth measurement circuit 602(6) may output a sixth sense result signal SR6 indicating a number of delayed clock pulses DCP it sensed as being present at the time it detected the starting transition of the data pulse DP.

Figure 7A:
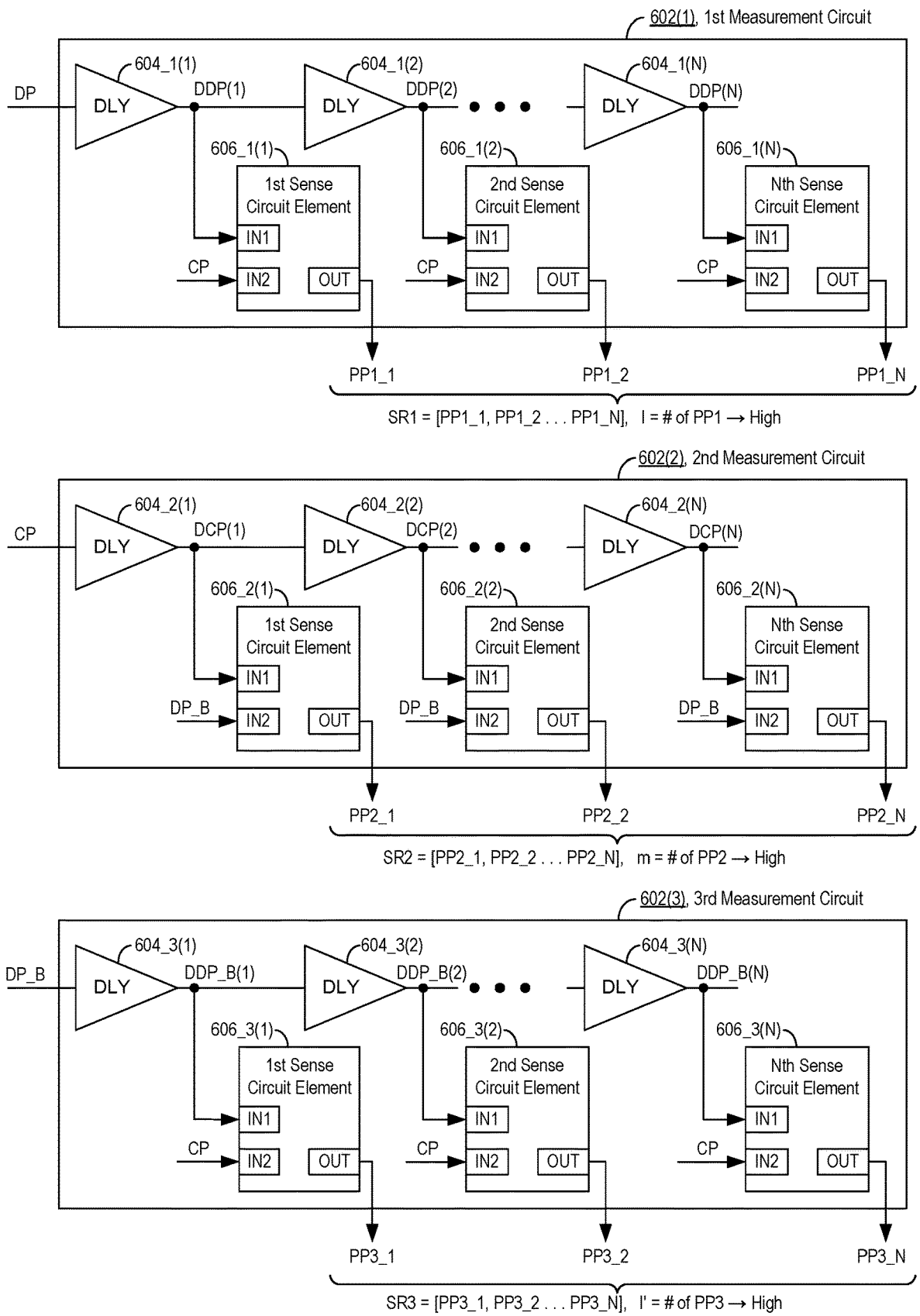
FIG. 7A is a block diagram of an example configuration of a first set of the measurement circuits of FIG. 6.
Figure 7B:
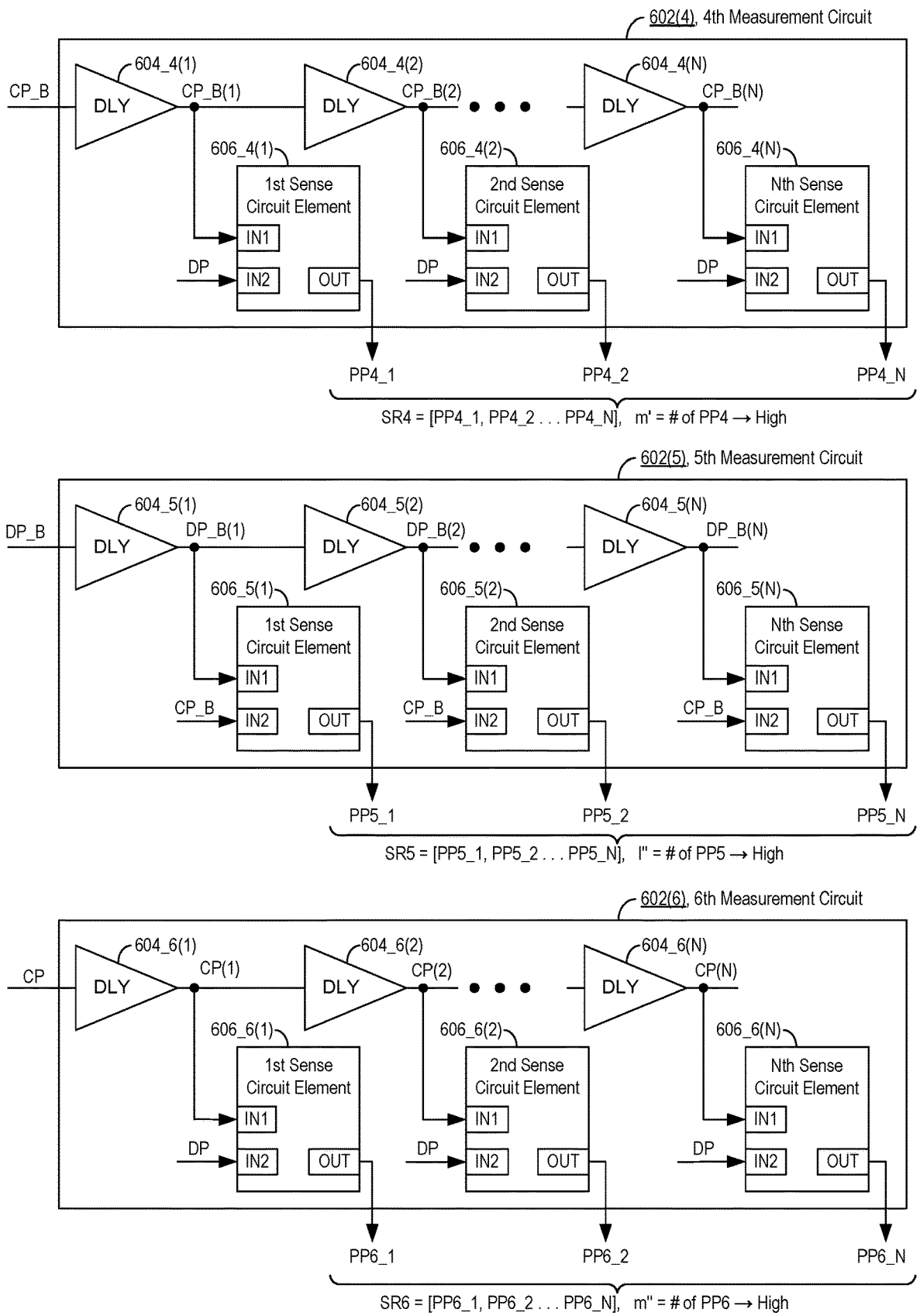
FIG. 7B is a block diagram of an example configuration of a second set of the measurement circuits of FIG. 6.

FIGS. 7A and 7B show block diagrams of example components of the delay circuit 502 and the sense circuit 504 arranged into the plurality of measurement circuits 602 of FIG. 6 in further detail. In the example configuration shown in FIGS. 7A and 7B, the example components of the delay circuit 502 may include a plurality of delay chains of delay circuit elements (DLY) 604 configured to generate the delayed pulses. Each measurement circuit 602 includes one of the plurality of delay chains. In addition, the example components of the sense circuit 504 include a plurality of sets sense circuit elements 606. Each measurement circuit 602 includes one of the sets of sense circuit elements 606.

In further detail, each ith measurement circuit 602(*i*) includes an associated ith delay chain configured to receive a first associated pulse. In addition, each ith delay chain includes an N-number of delay circuit elements (DLY) 604_*i*(1) to 604_*i*(N). Each jth delay circuit element of an ith delay chain DLYi(j) may be configured to delay an input pulse it receives by one delay unit. A delay unit may be a unit of time delay or a unit of phase delay. Accordingly, each output pulse a jth delay circuit element DLYi(j) outputs is delayed by one delay unit relative to the input pulse that the jth delay circuit element DLYi(j) receives. In addition, each delayed pulse a jth delay circuit element DLYi(j) of an ith delay chain outputs is delayed a j-number of delay units relative to the first associated pulse that the ith delay chain receives.

Also, each ith measurement circuit 602 may include an associated ith set of sense circuit elements 606_*i*. Each ith set of sense circuit element 606_*i* may include an N-number of sense circuit elements 606_*i*(1) to 606_*i*(N). Each jth sense circuit element of an ith set 606_*j*(*i*) may include two inputs, including a first input IN1 configured to receive a first input signal and a second input IN2 configured to receive a second input signal, and an output OUT configured to output an output signal. The first input IN1 may receive as its first input signal an associated delayed pulse that is output from an associated jth delay circuit element 604_*i*(*j*). The second input IN2 may receive as its second input signal an associated pulse from the input circuit 402. In addition, each jth sense circuit element 606_*j*(*i*) may be configured to output an associated pulse presence signal PPi_j indicating that it sensed the associated pulse was present or absent at its first input IN1 at the time of sensing.

In addition, each jth sense circuit element 606_*i*(*j*) may be configured to detect starting transitions of pulses it receives at its second input IN2. In response to or at the time of detecting a starting transition of a pulse at its second input IN2, a jth sense circuit element 606_*i*(*j*) may sense for an associated delayed pulse at its first input IN1. In order to sense for an associated delayed pulse at its first input IN1, the jth sense circuit element 606 may be configured to detect, sample, obtain, capture, hold, store, latch onto, or otherwise determine a level, such as voltage level, generated at its first input IN1. An example type of sense circuit element may be a flip-flop circuit, although other circuit configurations for the sense circuit elements may be possible.

In the event that the jth sense circuit element 606_*i*(*j*) detects a high level at its first input IN1 at the time it detects a starting transition at its second input IN2, the jth sense circuit element 606_*i*(*j*) may generate and output an associated pulse presence signal PPi_j at a first level to indicate that it detected or sensed that the associated delayed pulse was present at its first input IN1 at the time of sensing. Alternatively, in the event that the jth sense circuit element 606_*i*(*j*) detects a low level at its first input IN2 at the time it detects a starting transition at its second input IN2, the jth sense circuit element 606_*i*(*j*) may generate and output an associated pulse presence signal PPi_j at the second level to indicate that it detected or sensed that the associated delayed pulse was absent at its first input IN1 at the time of sensing.

As previously described, each delayed pulse a jth delay circuit element DLYi(j) outputs is delayed a j-number of delay units relative to the first associated pulse that the ith delay chain receives. Accordingly, if an associated jth sense circuit element 606_*i*(*j*) senses that the associated delay pulse it receives at its first input IN1 is present, then the pulse presence signal PPi_j that it outputs is an indication that the starting transition of the first associated pulse occurred at least a j-number of delay units ahead or in advance of the starting transition of the pulse it received at its second input IN2. For each ith timing relationship measurement for an ith permutation, the position value generation circuit 506 may be configured to identify the levels of the associated pulse presence signals PPi, which for some example configurations may be indicated by an associated ith sense result signal SRi, to determine the j-number of delay units ahead or in advance that the starting transition of the associated first pulse occurred relative to the starting transition of the pulse the ith sense circuits elements 606_*i* received at their second input IN2. The j-number of delay units may correspond and/or equal the sense result number to which the position value generation circuit sets the associated ith position value.

Each ith sense result signal SRi that an associated ith measurement circuit 602(*i*) outputs may include associated pulse presence signals PP_i and/or include or carry an N-bit pulse presence value, where each bit or digit of the pulse presence value corresponds to one of the associated pulse presence signals PP and has a logic value corresponding to the level at which the associated pulse presence signal PP was generated. That is, each bit or digit of the pulse presence value may have a first logic value corresponding to the first level to indicate that an associated delayed pulse was present at the time of sensing, or may have a second logic value corresponding to the second level to indicate that the associated delayed pulse was not present (or absent) at the time of sensing. The number of bits or digits that have the first logic value may be and/or correspond to an associated pulse presence number.

Referring back to FIG. 5, the position value generation circuit 506 may be configured to receive the sense result signals SR from the sense circuit 504. In response, the position value generation circuit 506 may be configured to determine the pulse presence number for each sense result signal SR by identifying the number of associated pulse presence signals PP at the first level and/or by counting or otherwise identifying the number of bits or digits of the N-bit pulse presence value that have the first logic value. In response, the position value generation circuit 506 may generate or set an associated position value to the identified pulse presence number. In particular, the position value generation circuit 506 may be configured to generate or set: a first position value l to a first pulse presence number indicated by the first sense result signal SR; a second position value m to a second pulse presence number indicated by the second sense result signal SR2; a third position value l' to a third pulse presence number indicated by the third sense result signal SR3; a fourth position value m' to a fourth pulse presence number indicated by the fourth sense result signal SR4; a fifth position value l" to a fifth pulse presence number indicated by the fifth sense result signal SR5; and a sixth position value m" to a sixth pulse presence number indicated by a sixth sense result signal SR6. The first position value l quantifies a position of the starting transition of a data pulse DP relative to a position of the starting transition of a clock pulse CP. The second position value m quantifies a position of the starting transition of a clock pulse CP relative to a position of the ending transition of a data pulse DP. The third position value l' quantifies a position of the ending transition of a data pulse DP relative to a position of the starting transition of a clock pulse CP. The fourth position value m' quantifies a position of the ending transition of a clock pulse CP relative to the position of the starting transition of a data pulse DP. The fifth position value l" quantifies a position of the ending transition of a data pulse DP relative to the position of the ending transition of a clock pulse CP. The sixth position value m" quantifies a position of the starting transition of a clock pulse CP relative to the position of a starting transition of a data pulse DP.

For particular example configurations, the first level of the pulse presence signals PP is a high level, the first logic value of the digits of the N-bit pulse presence values is a logic 1 value corresponding to the high level, the second level of the pulse presence signals PP is a low level, and the second logic value of the digits of the N-bit pulse presence values is a logic 0 value corresponding to the low level. Accordingly, to determine a pulse presence number of a received ith sense result signal SRi, the position value generation circuit 506 may be configured to identify the number of associated pulse presence signals PP at the high level or identify the number of bits or digits of the N-bit pulse presence value that have the logic 1 value—i.e., identify the of logic 1 values of the N-bit pulse presence value. Other configurations may be possible, including those where the position value generation circuit 506 identifies the number of associated pulse presence signals PP at the low level and/or identifies a number of bits of the N-bit pulse presence value at the logic 0 value, may be possible.

Referring back to FIG. 4, the position quantification circuit 408 may be configured to output the position values—including the first position value l, the second position value m, the third position value l', the fourth position value m', the fifth position value l", and the sixth position value m"—to the delay amount determination circuit 410. Also, as shown in FIG. 4, the delay amount determination circuit 410 may also be configured to receive the skew case indication signal SC from the skew case identification circuit 404. In response to receipt of the skew case indication signal SC and the position values, the delay amount determination circuit 410 may determine a delay amount (DA), which is an amount to delay either the clock signal CLK or the data signal DATA to position the clock pulses of the clock signal CLK in target sampling positions.

For some example configurations, the delay amount determination circuit 410 may be configured to determine delay amounts DA for associated sets of position values according to the plurality of skew cases. In particular, the delay amount determination circuit 410 may be configured to determine a delay amount DA according to a function that is dependent on the skew case indicated in the skew case indication signal SC. That is, the delay amount determination circuit 410 may be configured to use a plurality of functions to calculate delay amounts DA for given sets of position values, where each function corresponds to a different one of the skew cases. For some example configurations, each function associated with a different skew case may use as inputs a different subset of the position values, include different mathematical operations, or a combination thereof. Upon receipt of a skew case indication signal SC, the delay amount determination circuit may identify or select one of the plurality of functions that corresponds to skew case indicated by the skew case indication signal SC, and input at least one of the received position values into the function to the determine an associated delay amount DA.

In some example configurations, the resulting delay amount DA that the delay amount determination circuit 410 determines may correspond to or indicate a number of delay units, delay counts, or shifts to delay either the clock signal CLK or the data signal DATA to position the clock pulses of the clock signal in their target sampling positions. For configurations where the delay amount determination circuits uses functions to determine the delay amounts DA, each function that the delay amount determination circuit 410 uses may calculate a number of delay units, delay counts, or shifts.

In addition, where the delay amount determination circuit 410 uses functions to determine the delay amounts DA, each function may be associated with a centering action, including a delay of the clock signal CLK or a delay of the data signal DATA. As previously described the centering action selection circuit 406 may select a centering action to delay the clock signal CLK for skew cases where the sampling transition of the clock pulse occurs earlier than the target sampling time—e.g., skew cases one, four, five, and six as illustrated in FIGS. 3B-3G. Accordingly, through use of functions associated with these skew cases, the delay amount determination circuit 410 may determine delay amounts DA to delay the clock signal CLK. On the other hand, the centering action selection circuit 406 may select a centering action to delay the data signal DATA for skew cases where the sampling transition of the clock pulse occurs later than the target sampling time—e.g., skew cases two and three as illustrated in FIGS. 3B-3G. Accordingly, through use of functions associated with these skew cases, the delay amount determination circuit 410 may determine delay amounts DA to delay the data signal DATA.

The following are mathematical representations of six example functions, each corresponding to one of the six skew cases identified in FIGS. 3B-3G, that the delay amount determination circuit 410 may use to calculate a data amount DA for a given set of position values:

$$DA = \frac{(m-l)}{2} \quad \text{Skew Case 1}$$

$$DA = \left(\frac{l+l'}{2}\right) \quad \text{Skew Case 2}$$

$$DA = \frac{(l-m)}{2} \quad \text{Skew Case 3}$$

$$DA = \frac{m''+m}{2} \quad \text{Skew Case 4}$$

$$DA = \frac{(m+m'')}{2} \quad \text{Skew Case 5}$$

$$DA = \frac{m}{2} \quad \text{Skew Case 6}$$

As depicted, the above functions each utilize a divide-by-two operation to correspond to a shift-right operation of a delay path that delays the clock signal CLK or the data signal DATA by the number of shift-rights indicated by the delay amounts DA.

Also, as depicted, each function uses a respective subset of the position values and at least two of the functions use different subsets of the position values to determine an associated delay amounts DA. For the first skew case, where the sampling transition of the clock pulse CP occurs after the starting transition of the data pulse DP but earlier than the target sampling time, the delay amount determination circuit 410 may determine the delay amount DA based on the first position value l and the second position value m. For the second skew case, where the sampling transition of the clock pulse CP occurs later than the target sampling time and after the ending transition of the data pulse DP, the delay amount determination circuit 410 may determine the delay amount DA based on the first position value l and the third position value l'. For the third skew case, where the sampling transition of the clock pulse CP occurs later than the target sampling time but before the ending transition of the data pulse DP, the delay amount determination circuit 410 may determine the delay amount DA based on the first position value l and the second position value m. For the fourth skew case, where the sampling transition of the clock pulse CP occurs earlier than the target sampling time and before the starting transition of the data pulse DP, the delay amount determination circuit 410 may determine the delay amount DA based on the second position value m and the sixth position value m". For the fifth skew case, where the sampling transition of the clock pulse CP occurs earlier than the target sampling time and before the starting transition of the data pulse DP, and where a next clock transition of the clock signal CLK that immediately follows the sampling transition occurs before the starting transition of the DP, the delay amount determination circuit 410 may determine the delay amount DA based on the second position value m and the sixth position value m". For the sixth skew case, where the sampling transition of the clock pulse CP occurs at or very close to the starting transition of the data pulse DP, the delay amount determination circuit 410 may determine the delay amount DA based on the second position value m. Other ways to determine a delay amount DA based on the skew cases and the position values may be possible.

The output circuit 414 may be configured to receive the clock signal CLK and the data signal DATA, and delay the clock signal CLK or the data signal DATA by the delay amount DA and as indicated by the centering action signal. The delay control circuit 412 may be configured to control the delay of the clock signal CLK and the data signal DATA in the output circuit 414. In particular, the delay control circuit 412 may receive the centering action signal CA and the delay amount DA from the centering action selection circuit 406 and the delay amount determination circuit 410, respectively. In response, the delay control circuit 412 may determine a data delay DD for delay of the data signal DATA and a clock delay CD for delay of the clock signal CLK. For situations where the centering action signal CA indicates to delay the clock signal CLK, the delay control circuit 412 may determine to set the clock delay CD to a non-zero delay amount or value corresponding to the delay amount DA, also set the data delay DD to a corresponding zero-delay value that so that the data signal DATA is not delayed relative to the clock signal CLK, and may set the clock delay CD to a value corresponding to the delay amount DA. Alternatively, for situations where the centering action signal CA indicates to delay the data signal DATA, the delay control circuit 412 may set the CD to a corresponding zero-delay value so that the clock signal CLK is not delayed relative to the data signal DATA, and may set the data delay DD to a value corresponding to the delay amount DA.

The output circuit 414 may include a data delay circuit 416 and a clock delay circuit 418. Each of the data delay circuit 416 and the clock delay circuit 418 may be configured to delay the respective data signal DATA and the clock signal CLK by an amount corresponding to values indicated by the respective data delay DD and clock delay CD values. Upon determining the value of the data delay DD, the delay control circuit 412 may output the data delay DD (or a control signal corresponding to the data delay value) to delay the data signal DATA by an amount corresponding to the value of the data delay DD. Similarly, upon determining the value of the clock delay CD, the delay control circuit 412 may output the clock delay CD (or a control signal corresponding to the clock delay value) to delay the clock signal CLK by an amount corresponding to the value of the clock delay CD.

The data delay circuit 416 and the clock delay circuit 418 may be implemented as delay paths or delay lines in various ways and/or have any of various types of delay configurations in order to respectively receive the data signal DATA and the clock signal CLK, respectively delay the data signal DATA and the clock signal CLK by amounts corresponding to the amounts or values of the data delay DD and the clock delay CD, and respectively generate and output an output data signal DATA_OUT and an output clock signal CLK_OUT, where each of the output data signal DATA_OUT and the output clock signal CLK_OUT is a respective delayed versions of the data signal DATA and the clock signal CLK according to the respective data and clock delay amounts DD, CD.

The output circuit 414 may be referred to or considered a centering circuit in that by delaying the data signal DATA or the clock signal CLK according to the data and clock delay amounts DD, CD, the output circuit 414 positions the clock pulses CP of the clock signal CLK in their target sampling positions. That is, the delaying performed by the output circuit 414 centers the sampling transitions of the clock pulses in the centers of their associated data pulses.

The output circuit 414, such as with the data delay and clock delay circuits 416, 418, may output the output data and clock signals DATA_OUT, CLK_OUT downstream to a sampling circuit of the receiving circuit 104, which may sample (or otherwise capture, obtain, latch onto, or detect) the levels of the data pulses of the output data signal DATA_OUT in response to detection of the sampling transitions of the output clock signal CLK_OUT. By having been subjected to the centering action performed with the output circuit, the sampling circuit may optimally sample the levels of the data pulses—i.e., sample the levels of the data pulses at optimal times, which may result in better sampling accuracy performed by the sampling circuit.

In some example configurations, the skew correction system 400 may be configured to perform the skew correction process as part of a calibration process, where the delay control circuit 412 determines the data delay DD and the clock delay CD values as part of the calibration process. After determining the data delay DD and the clock delay CD values, the delay control circuit 412 may be configured to store the data delay DD and clock delay CD values in a data and clock delay value storage area 420. The skew correction system 400 may be configured to be enabled and disabled. For example, the skew correction system 400 may include or be in communication with a calibration enable circuit 422 that is configured to enable and disable the skew correction system 400, such as through output of a calibration enable signal EN. For some example configurations, the calibration enable circuit 422 may be located on and/or be a component of the receiving circuit 104. For other example configurations, the calibration enable circuit 422 may be located on and/or be a component of the sending circuit 102. For clarity, enable inputs of the circuit components of the skew correction system 400 are not shown. In the event that the skew correction system 400 is enabled, the system 400 may perform a skew correction process for a given pair of received data and clock signals DATA, CLK, resulting in the delay control circuit 412 determining data delay and clock delay values DD, CD for controlling how much the output circuit 414 delays that given pair of received data and clock signals DATA, CLK. Alternatively, in the event that the skew correction system 400 is disabled, the delay control circuit 412 may be configured to access the data and clock delay value storage 420 to access data and clock delay values DD, CD it determined from a prior skew correction process, and use those data and clock delay values DD, CD to control the delay of the data and clock signals DATA, CLK that are currently being received.

In some example configurations, the skew correction system 400 may be configured to perform a skew correction process in response to clock jitter and/or data jitter exceeding a predetermined threshold. In general, jitter refers to timing variations in rising and falling transitions from ideal timing positions. Jitter can be across cycles of a signal. Clock jitter is timing variations in the rising and falling transitions of a clock signal across a plurality of cycles. Variations in the rise and fall times of the clock signal may cause the duty cycle of the clock signal to be different from an ideal value of 50%. Also, clock jitter may be characterized as or included in clock uncertainty measurement and/or may be represented as a clock uncertainty value.

A data signal may also have jitter, which may be caused where the sending circuit 102 uses a clock signal with clock jitter to generate and output the data signal. Data jitter may be characterized as or included in a data uncertainty measurement, which characterizes and/or quantifies noise in the data signal where such noise can cause data pulses of the data signal to deviate from the correct logic values to which they correspond.

Clock jitter and/or data jitter may be used to quantify distortion of a clock signal, distortion or a data signal, or distortion of the clock and data signals in combination. Certain systems in which the skew correction system 400 may be implemented may have and/or be bounded by, such as in the form of or as part of a jitter protocol, an associated predetermined acceptable amount of distortion in the clock and/or data signals for reliable communication of the clock and data signals. The acceptable amount of distortion may be represented as a percentage or a range of percentages of or with respect to cycle time. The acceptable amount may be different for different parts of the system and/or for different types of communication schemes. As non-limiting examples, in NAND memory, acceptable amounts of distortion may be associated with and/or assigned for Toggle Mode specifications, memory interfaces of NAND memory dies, and DDR communication.

As previously described, the sampling circuitry of the receiving circuit 104 may be configured with a certain setup and hold requirement in order for the sampling circuitry to accurately identify the levels of the data pulses within a sample and hold window, which may also be referred to as a data valid window. The sample and hold requirements may factor in the data uncertainty or data jitter when determining an amount of the data valid window. For example, system design may dictate that the amount of the data valid window is greater than the setup time plus the hold time plus the clock uncertainty value. This, in turn, may yield a system timing margin equal to the amount of the data valid window minus the setup time, minus the hold time, and minus the clock uncertainty value. Otherwise stated, system timing margin is the amount that the data valid window is greater than the sum of the setup time plus the hold time plus the clock uncertainty value.

As previously described, for some example configurations, a resulting delay amount DA that the delay amount determination circuit 410 determines may correspond to or indicate a number of delay units, delay counts, or shifts to delay either the clock signal CLK or the data signal DATA to position the clock pulses of the clock signal in their target sampling positions. In some example configurations, a given delay amount DA that the delay amount determination circuit 410 determines is an ideal or a required value, which in some situations, may be in the form of a fraction. The actual delay by which the data delay circuit 416 delays the data signal DATA or the clock delay circuit 418 delays the clock signal CLK, as indicated by the data delay value DD or the clock delay value CD respectively, may directly correspond to the ideal delay amount value DA or may be an estimated or achievable amount, such as a rounded amount or one that corresponds to an integral multiple of the delay amount value DA.

The number of delay units, counts, or shifts indicated by the delay amount DA and the actual delay by which the data delay circuit 416 delays the data signal DATA or the clock delay circuit 418 delays the clock signal may be set so that the difference between the ideal or required delay as indicated by the delay amount values DA and the actual delay by which the delay circuits 416, 418 will delay the data signal DATA or the clock signal CLK is less than the system timing margin. However, an increase in jitter in the clock signal CLK or the data signal DATA may decrease the actual system timing margin. As a result, too high of an increase in jitter may lower the actual system timing margin such that the difference between the ideal delay and the actual delay exceeds the actual system timing margin.

For some example configurations, the calibration enable circuit 422 may be configured to determine whether to enable or disable the skew correction system 400 based on an error in the data signal DATA. The error in the data signal DATA may indicate whether positive system margin exists, and in turn whether to have skew correction performed. The calibration enable circuit 422 may be configured to receive the data signal DATA, determine or measure an error value of the data signal DATA, and compare the error value with a threshold value. If the determines calibration enable circuit 422 determines that the measured error value exceeds the threshold value, then the calibration enable circuit 422 may output the enable signal EN to enable skew correction system 400 to cause the skew correction system 400 to perform a skew correction process on a next or new data signal DATA. Alternatively, as long as a measured error value is below the threshold, the calibration enable circuit 422 may determine to keep the skew correction system 400 disabled. In turn, the delay control circuit 412 will retrieve data and clock delay values DD, CD it determined from a prior skew correction process, and use those data and clock delay values DD, CD to control the delay of the data and clock signals DATA, CLK that are received.

The calibration enable circuit 422 may determine the error amount in various ways. For example, the calibration enable circuit 422 may determine the error amount by determining a number of bit errors over at least a portion of the data signal DATA. The number of bit errors may be indicated by a number of bits having an incorrect logic value, or a bit error rate value. In some example configurations, the calibration enable circuit 422 may be configured to compare a least a portion of an actual data pattern of logic 1 and logic 0 values that the received data signal DATA has with a known or predetermined data pattern representing the data pattern that the data signal DATA should have if it contained no errors. Based on the comparison, the calibration enable circuit 422 may determine the number or amount of bit errors. In other example configurations, the calibration enable circuit 422 may determine the error amount by determining a bit error rate (BER) associated with the data signal DATA, such as through an error correction or decoding process, where the calibration enable circuit 422 (or an error correction code (ECC) engine) uses certain bits, such as a check sum or ECC or parity bits appended to the data signal DATA. Various ways of determining an error of a data signal DATA and using the determined error to determine whether to have the skew correction system 400 enabled or disabled may be possible.

Also, in some example configurations, fluctuations or drift in temperature (e.g., operating temperature or environmental temperature) in the skew correction system 400, or fluctuations or drift in supply voltage to the skew correction system 400, may cause an undesirable alteration in the delay amount values DA and/or the data delay or clock delay amounts DD, CD. Accordingly, the calibration enable circuit 422 may be configured to monitor or identify the temperature of the skew correction system 400 and/or a level of the supply voltage supplied to the components of the skew correction system (collectively indicated in FIG. 4 as VT). Should either exceed a respective threshold, the calibration enable circuit 422 may be configured to output the enable signal EN to cause a new or another skew correction process so that new data delay and clock delay values DD, CD are determined.

In some example configurations where the calibration enable circuit 422 is part of the sending circuit 102, the sending circuit 102 may be configured to have a skew correction process performed using calibration data signals that do not carry data to be processed by the receiving circuit 104. The sending circuit 102 may send such calibration data signals for the sole purpose of having those calibration data signals used for skew correction. That is, the receiving circuit 104 may not sample the logic levels of data pulses of the calibration data signals and/or program data carried by the calibration data signals into memory of the receiving circuit 104. In addition, the sending circuit 102 may send at least one calibration data signal in between sending data signals that it wants the receiving circuit 104 to process. For example, suppose the sending circuit 102 has two data sets it wants the receiving circuit to process (e.g., store in its memory). Suppose the sending circuit 102 sends a first data signal carrying the first data set to the receiving circuit 104 with the receiving circuit 104 being disabled. Before sending a second data signal carrying the second data set to the receiving circuit 104, the sending circuit 102 may have the skew correction system 400 perform a skew correction process using a calibration data signal. That is, after sending the first data signal and before sending the second data signal, the sending circuit 102, via its calibration enable circuit 422, may output the enable signal EN to the skew correction system 400 to enable it. Then, the sending circuit 102 may send a calibration data signal along with a clock signal CLK. In response, the skew correction system 400 may perform a skew correction process and generate new data delay and clock delay values DD, CD. The sending circuit 102 may then disable the skew correction system 400, and subsequently output the second data signal carrying the second data signal, along with a clock signal. In response, the skew correction system 400 may use the new data delay and clock delay values DD, CD to determine how to delay the clock signal CLK and the second data signal carrying the second data set. Various ways of enabling and disabling the skew correction system 400 in between transmission of data signals carrying data sets to be processed by the receiving circuit 104 may be possible.

Figure 8:
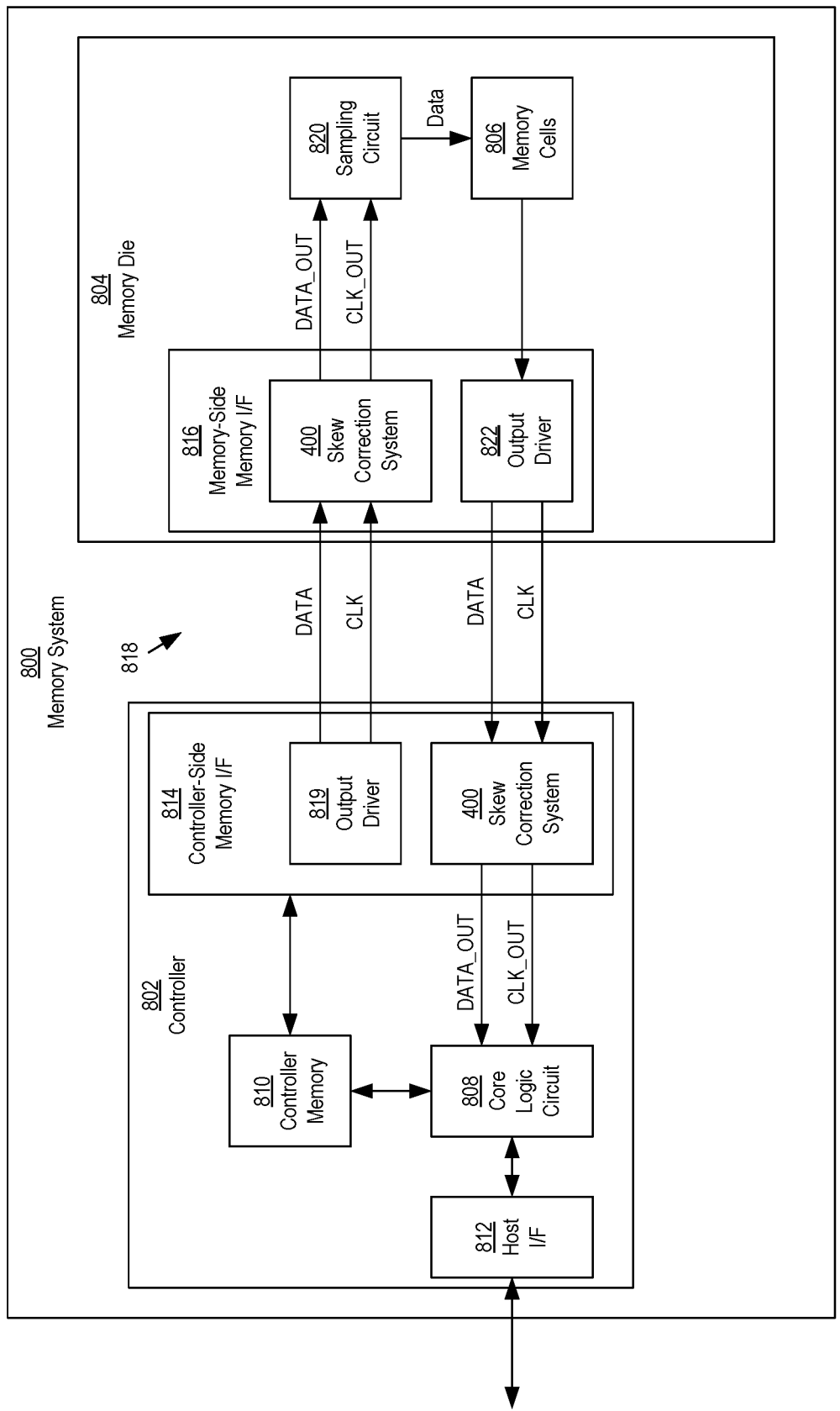
FIG. 8 is a block diagram of a memory system in which the skew correction system of FIG. 4 may be implemented.

FIG. 8 shows a block diagram of an example memory system 800 that includes at least one skew correction system 400 as shown and described with reference to FIGS. 4-7B and/or that may be representative of example configurations of the sending circuit 102 and the receiving circuit 104 of FIG. 1. The memory system 800 may be configured to be connected to and/or in communication with a host system (not shown). The host system may be any electronic system or device that is configured to communicate and/or operate with the memory system 800.

The memory system 800 may include a controller 802 and a memory die 804. The memory die 804 may include a memory cell structure 806 of memory cells or elements, with each memory cell or element being configured to store one or more bits data. Any suitable type of memory cells can be used. As examples, the memory cells may be volatile memory such as dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), phase-change memory ("PCM"), other elements comprising semiconductor or other material capable of storing information, or various combinations thereof. Each type of memory may have different configurations. For example, flash memory may be configured in a NAND or a NOR configuration.

The memory cells can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

The controller 802 may include a core logic circuit 808. The core logic circuit 708 may be configured to perform memory management functions, non-limiting examples of which may include, but not limited to, communicating with the host system, including receiving, handling, and responding to host requests or commands, such as read, write, erase, and status requests/commands received from the host system; error detection and correction (which may be part of handling host requests/commands); formatting the memory cells 806 to ensure it is operating properly; mapping out bad memory cells; allocating spare cells to be substituted for future failed cells; wear leveling (distributing writes to avoid wearing out specific blocks of memory that would otherwise be repeatedly written to); garbage collection (after a block is full, moving only the valid pages of data to a new block, so the full block can be erased and reused); folding operations (moving data from a lower density memory area to a higher density memory area of the memory 806); and transitioning the memory system 800 between different states, operation modes, and/or power consumption modes. In operation, when the host system needs to read data from or write data to the memory 806, it may communicate with the core logic circuit 808. The core logic circuit 808 may include hardware or a combination of hardware and software. For example, the core logic circuit 808 may include a central processing unit, an application specific integrated circuit (ASIC), a field programmable gate array (FPGA), a digital logic circuit, an analog circuit, a combination of discrete circuits, gates, or any other type of hardware, or a combination thereof.

The controller 802 may also include controller memory 810, which may include volatile memory (e.g., random access memory (RAM)), non-volatile memory (e.g., read-only memory (ROM)), or a combination thereof. The controller memory 810 may store software or firmware instructions and/or certain data structures, such as address translation data structures, that the core logic circuit 808 may access and/or and execute to perform at least some of its memory management functions. Additionally, the core logic circuit 808 may temporarily store data that is to be transferred to and stored in the memory cells 806 such as in response to a host write command, and/or that was retrieved from the memory cells 806 and is to be sent to the host system, such as in response to a host read command. FIG. 8 shows the controller memory 810 as a component of the controller 802, although in other example configurations, at least some of the controller memory 810 may be a component of the memory system 800 that is separate from the controller 802. For example, the controller 802 may be an integrated circuit, and depending on the configuration of the memory system 800, the controller memory 810 may be located on the integrated circuit, partially on the integrated circuit and partially separate from the integrated, or completely separate from the integrated circuit.

The controller 802 may further include a host interface (I/F) 812. The core logic circuit 808 may be configured to communicate with a host system via a host interface 812. In addition, the controller 802 may include a controller-side memory interface (I/F) 814 through which the controller 802 is configured to communicate with the memory die 704. Similarly, the memory die 804 may include a memory-side memory interface (I/F) 816 through which the memory die 804 is configured to communicate with the controller 802. As shown in FIG. 8, the memory-side memory interface 816 may include the skew correction system 400, although in other example configurations, the skew correction system 400 may be considered a component of the memory die 804 separate from the memory-side memory interface 816.

When the controller 802 wants to program data stored in the memory cells 806, such as in response to receipt of a host write or program request from the host system, the controller 802 may send a data signal DATA that includes the data to be programmed along with or in parallel with a clock signal CLK via communications bus 818 that connects or couples the controller-side and memory-side memory interfaces 814, 816. In some example configurations, the controller-side memory interface 814 may include an output driver 819 to output the data signal DATA and the clock signal CLK. The memory die 804 may include a sampling circuit 820 that is configured to sample data pulses in response to detecting sampling transitions of associated clock pulses to identify the logic values of the data. The sampling circuit 820 may include any of various types of circuits configured to sample, capture, obtain, latch onto, hold, store, or otherwise identify or determine levels of data pulses in response to detecting sampling transitions of clock pulses, examples of which include flip flops and latches. Although not shown, the sampling circuit 820 may be part of program circuitry located on the memory die 804 that is configured to program the data included in the data signal DATA into the memory cells 806.

Rather than directly receive the data signal DATA and the clock signal CLK from the controller 802, the sampling circuit 820 may receive the output data and clock signals DATA_OUT, CLK_OUT—i.e., data and clock signals subjected to a skew correction process—from the skew correction system 400. That is, the skew correction system 400 may receive the data and clock signals DATA, CLK from the controller 802, delay the data signal DATA or the clock signal CLK according to determined data and clock delay values DD, CD, and output the output data and clock signals DATA_OUT, CLK_OUT to the sampling circuit 820. Since the sampling circuit 820 will receive data and clock signals that have been minimized for skew, it may more accurately identify the logic levels of the data to be programmed into the memory cells 806 compared to if it received clock and data signals that were received from the controller 802 without being subjected to the skew correction process.

For some example configurations, when the controller 802 wants to have a data set programmed into the memory cells 802, it may add or append a predetermined number of one or more calibration data pulses to the data signal DATA. In particular example configurations, the controller 802 may add the one or more calibration data pulses at the beginning of the data signal DATA such that the initial data pulse(s) that the skew correction system 400 receives is/are the calibration data pulses. The controller 802 may also add or append a predetermined number of calibration clock pulses to the clock signal CLK. The term calibration data pulse is used herein to refer to a data pulse of a data signal DATA that does not include or carry data that the controller 802 wants programmed into the memory cells 806. Also, the term calibration clock pulse is used herein to refer to a clock pulse associated with a calibration data pulse, and/or a clock pulse that is not intended to be used to sample a data pulse including or carrying data that the controller 802 wants programmed into the memory cells 806. In addition or alternatively, the terms calibration data pulse and calibration clock pulse are used to refer to pulses of the data signal DATA and the clock signal CLK that are used by the skew correction system 400 to perform its skew correction process. That is, the skew correction system 400 may detect the skew cases and determine the position values using the calibration data and clock pulses of the data and clock signals DATA, CLK.

Also, as shown in FIG. 8, the controller 802 may also include a skew correction system 400. FIG. 8 shows the skew correction system 400 of the controller 802 as a component of the controller-side memory interface 814, although other configurations may be possible. When the controller 802 wants to read data stored in the memory cells 806, the data may be communicated to an output driver circuit 822 of the memory-side memory interface 816. The output driver 822 may transmit a data signal DATA that includes the data along with a clock signal CLK. The controller 802 may use the clock pulses of the clock signal CLK to identify the logic levels of the data signal. The data and clock signals DATA, CLK from the memory die 804 may be sent to the skew correction system 400 of the controller 802, and the skew correction system 400 may perform its skew correction process to output corresponding output data and clock signals DATA_OUT, CLK_OUT to the core logic circuit 808, or other circuitry of the controller 802 configured to sample the levels of the data pulses. Similar to the controller's configuration, when sending the data and clock signals DATA, CLK, the output driver 822 of the memory die 804 may include one or more calibration data pulses in the data signal DATA and one or more calibration clock pulses in the clock signal CLK. The skew correction system 400 of the controller 802 may use those calibration pulses to perform its skew correction process.

For some example configurations, the predetermined number of calibration data and clock pulses is one—i.e., the controller 802 or the memory die 802 appends one extra clock pulse to the clock signal CLK and one extra data pulse to the data signal DATA for a skew correction process to be performed. Numbers other than one for the predetermined number of calibration data and clock pulses may be possible. In this context, skew correction or a calibration process that calibrates for skew can be performed by the skew correction system 400 in a single cycle of the clock signal CLK or in a number of cycles corresponding to the predetermined number.

Appending one or more extra data and clock pulses to the data and clock signals DATA, CLK and configuring the skew correction system(s) 400 to perform skew correction using the extra clock pulses may be a provide an improved skew correction process that has lower overhead compared to other more complicated skew correction processes, such as those involving handshaking or read/write training, which involve communication of larger amounts of information or take longer amounts of time. Also, by appending the extra data pulses, the skew correction system 400 may perform skew correction on the fly. That is, the skew correction system 400 on the memory die 804 may perform skew correction for each pair of data and clock signals DATA, CLK that the controller 802 sends to the memory die 804 for programming an associated data set during normal operation of the memory system 800. In addition or alternatively, the skew correction system 400 on the controller 802 may perform skew correction for each pair of data and clock signals DATA, CLK that the memory die 804 sends to the controller 802 for reading an associated data set during normal operation of the memory system 800. Such skew correction processes can, in turn, account for instantaneous changes or fluctuations in process-voltage-temperature (PVT) conditions, and thus avoids having to configure the memory die 804 from having to perform scheduled or periodic skew calibration processes, which can interrupt the normal flow or operation of the memory system 800.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
   one or more circuits configured to receive an input data signal and an input clock signal, delay a data pulse of the input data signal to generate delayed data pulses, delay a clock pulse of the input clock signal to generate delayed clock pulses, sense for presence or absence of the delayed data pulses and the delayed clock pulses in response to detection of transitions of an associated data pulse and an associated clock pulse, identify a skew case from a plurality of predetermined skew cases for the input data signal and the input clock signal, measure a plurality of timing relationships between transitions of the input data signal and the input clock signal, and generate a plurality of position values;
   wherein each of the plurality of position values indicates a number of delayed pulses sensed as being present at an associated time of sensing and quantifies relative positions of transitions of the input data signal and the input clock signal; and
   wherein the one or more circuits are further configured to delay the input clock signal by a delay amount based on the skew case and the plurality of position values to generate an output clock signal.

2. The circuit of claim 1, wherein the one or more circuits are further configured to select a centering action from a plurality of centering actions and to delay the clock signal based on the selected centering action.

3. The circuit of claim 2, wherein the plurality of centering actions comprises a delay of the input data signal and a delay of the input clock signal.

4. The circuit of claim 1, wherein the one or more circuits are further configured to determine the delay amount based on the selected skew case and the plurality of position values.

5. The circuit of claim 4, wherein the one or more circuits are further configured to select a function from a plurality of functions based on the selected skew case and input at least one of the plurality of position values to the selected function to determine the delay amount.

6. The circuit of claim 1, wherein the one or more circuits are further configured to receive an indication to delay the input clock signal and in response to receipt of the indication, set a data delay to a non-delay value.

7. The circuit of claim 6, wherein the indication comprises a first indication, wherein the one or more circuits are further configured to receive a second indication to delay the input data signal and in response to receipt of the second indication signal, set a clock delay to the non-delay value.

8. The circuit of claim 1 wherein the one or more circuits are further configured to perform a plurality of timing relationship measurements for the input data signal and the input clock signal, wherein, in order to perform a respective timing relationship measurement, the one or more circuits are configured to measure a different one of the plurality of timing relationships, each timing relationship corresponding to a different one of a plurality of permutations of transitions of the input data signal and the input clock signal and select a centering action from a plurality of centering actions according to the skew case.

9. The circuit of claim 8 wherein the one or more circuits include a plurality of sets of sense circuit elements, wherein each set is configured to output an associated set of pulse presence signals, wherein each pulse presence signal is at a first level to indicate that an associated one of the delayed pulses was present at a respective input of an associated one of the sense circuit elements or absent at the respective input.

10. The circuit of claim 8, wherein transitions of the transition permutations include starting and ending transitions of the input data signal and starting and ending transitions of the input signal.

11. The circuit of claim 10, wherein the one or more circuits are configured to perform at least two of:
    a first timing relationship measurement that quantifies a position of a starting transition of a data pulse relative to a position of a starting transition of a clock pulse;
    a second timing relationship measurement that quantifies a position of a starting transition of a clock pulse relative to a position of an ending transition of a data pulse;
    a third timing relationship that quantifies a position of an ending transition of a data pulse relative to a position of a starting transition of a clock pulse;
    a fourth timing relationship measurement that quantifies a position of an ending transition of a clock pulse relative to a position of a starting transition of a data pulse;
    a fifth timing relationship measurement that quantifies a position of an ending transition of a data pulse relative to an ending transition of a clock pulse; or
    a sixth timing relationship that quantifies a position of a starting transition of a clock pulse relative to a position of a starting transition of a data pulse.

12. The circuit of claim 1 wherein the one or more circuits are formed on a memory die, a memory array comprising a plurality of non-volatile memory cells formed on the memory die, and the memory die is connected to a controller by a communications bus.

13. A circuit comprising:
    an input circuit configured to receive an input data signal and an input clock signal;
    a skew case identification circuit configured to identify a skew case from a plurality of predetermined skew cases for the input data signal and the input clock signal;
    a position quantification circuit including:
        a delay circuit configured to delay a data pulse of the input data signal to generate delayed data pulses and delay a clock pulse of the input clock signal to generate delayed clock pulses, and
        a sense circuit configured to sense for presence or absence of the delayed data pulses and the delayed clock pulses in response to detection of transitions of an associated data pulse and an associated clock pulse,
    the position quantification circuit configured to measure a plurality of timing relationships between transitions of the input data signal and the input clock signal, generate a plurality of position values, wherein each of the plurality of position values quantifies relative positions of transitions of the input data signal and the input clock signal and indicates a number delayed pulses sensed as being present at an associated time of sensing; and an output circuit configured to delay the clock signal by a delay amount based on the skew case and the plurality of position values to output an output clock signal.

14. The circuit of claim 13, further comprising;
a centering action selection circuit configured to select a centering action from a plurality of centering actions, wherein the output circuit is configured to delay the clock signal based on the selected centering action, wherein the plurality of centering actions comprises a delay of the input data signal and a delay of the input clock signal.

15. The circuit of claim 13, further comprising a delay amount determination circuit configured to select a function from a plurality functions based on the selected skew case and input at least one of the plurality of position values to the selected function to determine the delay amount.

16. The circuit of claim 13 wherein the input circuit, the skew case identification circuit, the position quantification circuit, the output circuit and a memory array comprising a plurality of non-volatile memory cells are formed on a memory die that is connected to receive the input data signal and the input clock signal from a controller.

17. A method comprising:
receiving an input data signal and an input clock signal;
identifying a skew case from a plurality of predetermined skew cases for the input data signal and the input clock signal;
measuring a plurality of timing relationships between transitions of the input data signal and the input clock signal including:
delaying a data pulse of the input data signal to generate delayed data pulses;
delaying a clock pulse of the input clock signal to generate delayed clock pulses; and
sensing for presence or absence of the delayed data pulses and the delayed clock pulses in response to detection of transitions of an associated data pulse and an associated clock pulse;
generating a plurality of position values from the plurality of timing relationships, wherein each position value indicates a number of delayed pulses sensed as being present at an associated time of sensing and quantifies relative positions of transitions of the input data signal and the input clock signal; and
delaying the clock signal by a delay amount based on the skew case and the plurality of position values to generate an output clock signal.

18. The method of claim 17 further comprising:
selecting a centering action from a plurality of centering actions that includes a delay of the input data signal and a delay of the input clock signal, wherein the output circuit is configured to delay the clock signal based on the selected centering action.

* * * * *